United States Patent
Kim et al.

(10) Patent No.: US 11,574,963 B2
(45) Date of Patent: Feb. 7, 2023

(54) DISPLAY DEVICE WITH OPENING IN LIGHT-BLOCKING MEMBER AND METHOD FOR REPAIRING THE SAME

(71) Applicant: SAMSUNG DISPLAY CO., LTD., Yongin-si (KR)

(72) Inventors: Jong-Hoon Kim, Seoul (KR); Jeong Ki Kim, Hwaseong-si (KR); Jea Heon Ahn, Hwaseong-si (KR); MyoungJong Lee, Chungcheongnam-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 315 days.

(21) Appl. No.: 17/033,126

(22) Filed: Sep. 25, 2020

(65) Prior Publication Data

US 2021/0193742 A1 Jun. 24, 2021

(30) Foreign Application Priority Data

Dec. 18, 2019 (KR) ........................ 10-2019-0169707

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 51/5271* (2013.01); *H01L 51/5284* (2013.01); *H01L 51/56* (2013.01)

(58) Field of Classification Search
CPC combination set(s) only.
See application file for complete search history.

(56) References Cited

U.S. PATENT DOCUMENTS

2020/0212109 A1* 7/2020 Lee ...................... H01L 51/5268
2022/0019003 A1* 1/2022 Ahn ........................ G02B 5/201

FOREIGN PATENT DOCUMENTS

KR  10-2020-0068790   6/2020
WO  2020/116720       6/2020

* cited by examiner

*Primary Examiner* — Nduka E Ojeh
(74) *Attorney, Agent, or Firm* — F. Chau & Associates, LLC

(57) ABSTRACT

A display device having a first substrate including lower electrodes, an upper electrode and a light-emitting layer disposed between the lower electrodes and the upper electrode. A second substrate is combined with the first substrate and defines light-emitting areas. The second substrate includes a color filter layer overlapping the light-emitting areas. A light-blocking member overlaps a light-blocking area surrounding the light-emitting areas. The light-blocking member includes openings overlapping the lower electrodes.

22 Claims, 19 Drawing Sheets

DISPLAY DEVICE WITH OPENING IN LIGHT-BLOCKING MEMBER AND METHOD FOR REPAIRING THE SAME

This application claims priority under 35 U.S.C. § 119 to Korean Patent Application No. 10-2019-0169707, filed on Dec. 18, 2019 in the Korean Intellectual Property Office, the disclosure of which is incorporated by reference in its entirety herein.

TECHNICAL FIELD

Exemplary embodiments relate to a display device. More particularly, exemplary embodiments relate to a display device and a method for repairing the display device.

DISCUSSION OF RELATED ART

An organic light-emitting display device is a self-emission display device that may generate a color image without an additional light source, such as a backlight.

Recently, an organic light-emitting display device including a color-converting layer has been developed for improving a display quality. The color-converting layer may change a wavelength of a light generated by a light-emitting element. Therefore, the color-converting layer may output a light having a color that is different from an incident light. For example, the color-converting layer may include a wavelength-converting material, such as a quantum dot.

A laser may be irradiated onto an organic light-emitting display device for detection of a defective pixel, such as a defective pixel formed by impurities entering a pixel in a manufacturing process. The laser may be irradiated onto the defective pixel to induce a short of an anode and cathode thereby converting the defective pixel into a dark spot.

However, when an organic light-emitting display device includes a color-converting layer, a laser may be scattered by a wavelength-converting material or a scattering particle in the color-converting layer. Therefore, a normal pixel adjacent to the defective pixel may be damaged by the laser.

SUMMARY

Exemplary embodiments provide a display device that has an improved reliability and is easily repairable.

Exemplary embodiments provide a method for repairing the display device.

According to an exemplary embodiment, a display device has a first substrate including lower electrodes, an upper electrode and a light-emitting layer disposed between the lower electrodes and the upper electrode. A second substrate is combined with the first substrate and defines light-emitting areas. The second substrate includes a color filter layer overlapping the light-emitting areas. A light-blocking member overlaps a light-blocking area surrounding the light-emitting areas. The light-blocking member includes openings overlapping the lower electrodes.

In an exemplary embodiment, the color filter layer includes a first color filter overlapping a first light-emitting area emitting a first color light, and a second color filter overlapping a second light-emitting area emitting a second color light different from the first color light.

In an exemplary embodiment, the light-blocking member is formed from a same layer as the second color filter.

In an exemplary embodiment, the first color filter further overlap at least a portion of the openings of the light-blocking member.

In an exemplary embodiment, the second substrate further includes a color-converting layer overlapping the first light-emitting area and converting a wavelength of an incident light to emit the first color light.

In an exemplary embodiment, the light-blocking member is a partition wall receiving the color-converting layer.

In an exemplary embodiment, the second substrate further includes a compensation pattern disposed in the openings of the light-blocking member.

In an exemplary embodiment, the openings have different shapes from each other.

According to an exemplary embodiment, a display device includes a first substrate including pixel electrodes and a common electrode. A second substrate is combined with the first substrate. The second substrate defines a plurality of light-emitting areas, a light-blocking area surrounding the plurality of light-emitting areas and a marking area disposed in the light-blocking area. The marking area overlaps a corresponding pixel electrode and has a reflective characteristic to an external light that is different from a reflective characteristic of a remaining portion of the light-blocking area to the external light.

In an exemplary embodiment, the second substrate includes a color filter layer overlapping the light-emitting areas, a color-converting layer overlapping at least a portion of the light-emitting areas, and a partition wall receiving the color-converting layer and overlapping the light-blocking area.

In an exemplary embodiment, the color filter layer includes a first color filter overlapping a first light-emitting area emitting a first color light, and a second color filter overlapping the light-blocking layer and a second light-emitting area emitting a second color light different from the first color light.

In an exemplary embodiment, the second color filter includes an opening overlapping the marking area.

In an exemplary embodiment, the first color filter further overlaps the marking area and the opening of the second color filter.

In an exemplary embodiment, the first color filter further overlaps the marking area.

In an exemplary embodiment, the partition wall includes an opening overlapping the marking area.

In an exemplary embodiment, the second substrate further includes a compensation pattern disposed in the opening of the partition wall.

According to an exemplary embodiment, a method for repairing a display device that includes a first substrate and a second substrate combined with the first substrate. The first substrate including pixel electrodes and a common electrode. Light-emitting areas, a light-blocking area surrounding the light-emitting areas and a plurality of marking areas disposed in the light-blocking area and respectively overlapping a corresponding pixel electrode are defined on the second substrate. The method includes detecting a defective pixel of the display device. A laser is irradiated onto a first marking area of the plurality of marking areas. The first marking area corresponds to the defective pixel.

In an exemplary embodiment, the laser is a long-wavelength laser.

In an exemplary embodiment, the marking areas have a reflective characteristic to an external light, which is different from a reflective characteristic of the light-blocking area to an external light.

In an exemplary embodiment, the second substrate includes a light-blocking member overlapping the light-blocking area, and the light-blocking member includes openings overlapping the marking areas.

According to an exemplary embodiment, a display device includes a first substrate including a plurality of pixel electrodes, a common electrode and a plurality of driving elements connected to the plurality of pixel electrodes at a plurality of contact areas. A second substrate is combined with the first substrate. The second substrate includes a color filter layer including a first color filter, a second color filter and a third color filter overlapping a first light-emitting area, a second light-emitting area and a third light-emitting area, respectively. A light-blocking area surrounds the first light-emitting area, the second light-emitting area and the third light-emitting area. First to third marking areas are disposed in the light-blocking area adjacent to the first light-emitting area, the second light-emitting area and the third light-emitting area, respectively. The first to third marking areas overlap the plurality of pixel electrodes. At least one of the first to third marking areas also overlaps one contact area of the plurality of contact areas.

In an exemplary embodiment, at least one of the first to third marking areas is disposed between one light-emitting area of the first to third light-emitting areas and one contact area of the plurality of contact areas.

According to one or more exemplary embodiments, when a display device is repaired, a laser is irradiated onto a defective pixel through a light-blocking area, which does not include a wavelength-converting particle or a scattering particle. Thus, damage to the normal pixels by scattered laser may be prevented.

Furthermore, a display device includes a marking area for irradiating a laser accurately. Thus, a reliability of a display device and an efficiency of a repairing process may be improved.

BRIEF DESCRIPTION OF THE DRAWINGS

Features of one or more exemplary embodiments of the present inventive concepts will be more clearly understood from the following detailed description taken in conjunction with the accompanying drawings.

DETAILED DESCRIPTION OF EXEMPLARY EMBODIMENTS

Figure 1:
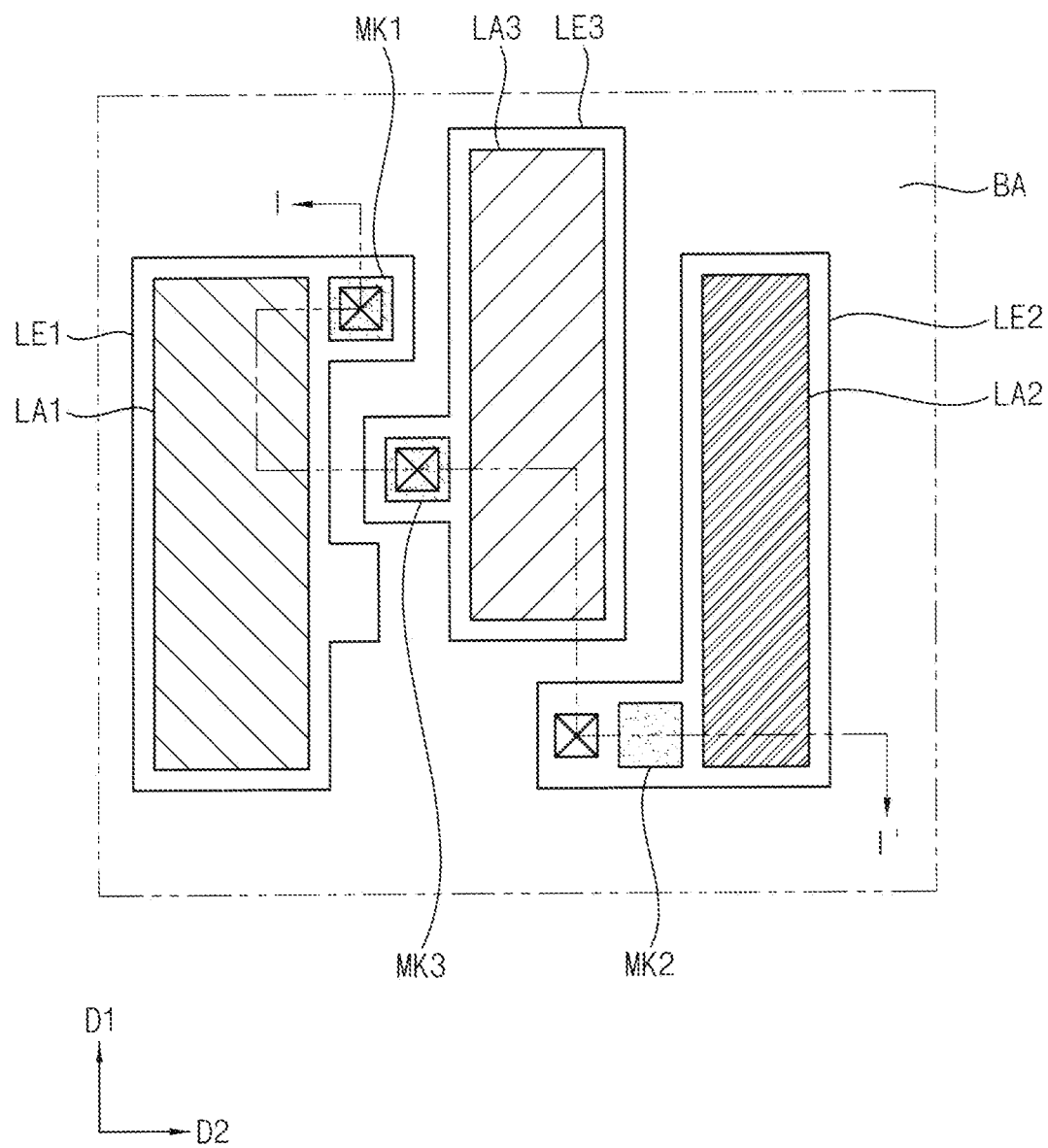
FIG. 1 is a plan view illustrating a display device according to an exemplary embodiment of the present inventive concepts.

A display device, a method for repairing a display device and a method for manufacturing a color-converting substrate of a display device according to exemplary embodiments of the present inventive concepts will be described hereinafter with reference to the accompanying drawings, in which some exemplary embodiments are shown. Same or similar reference numerals may be used for same or similar elements in the drawings.

Figure 2:
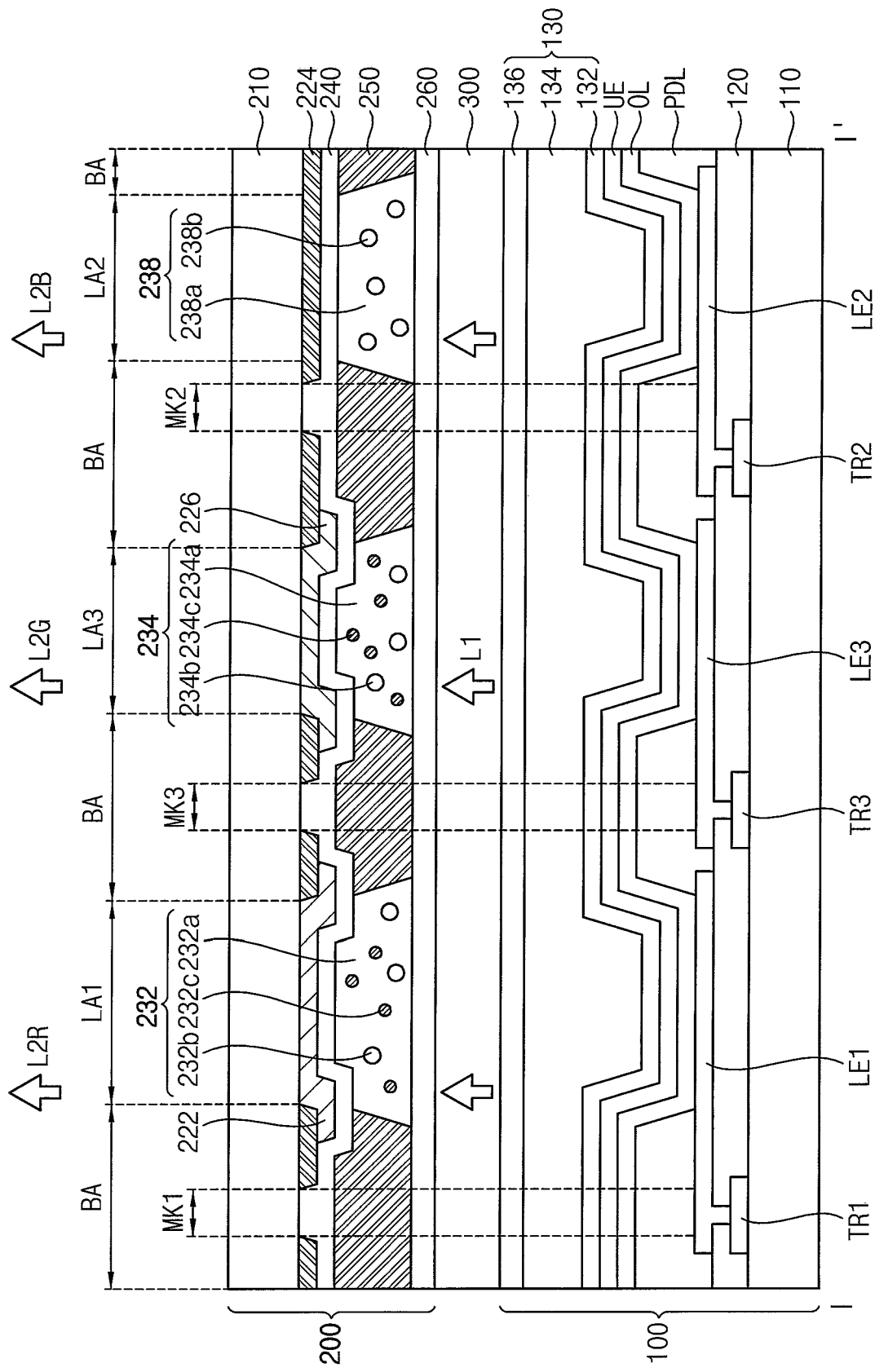
FIG. 2 is a cross-sectional view taken along the line I-I' of FIG. 1 according to an exemplary embodiment of the present inventive concepts.
Figure 3:
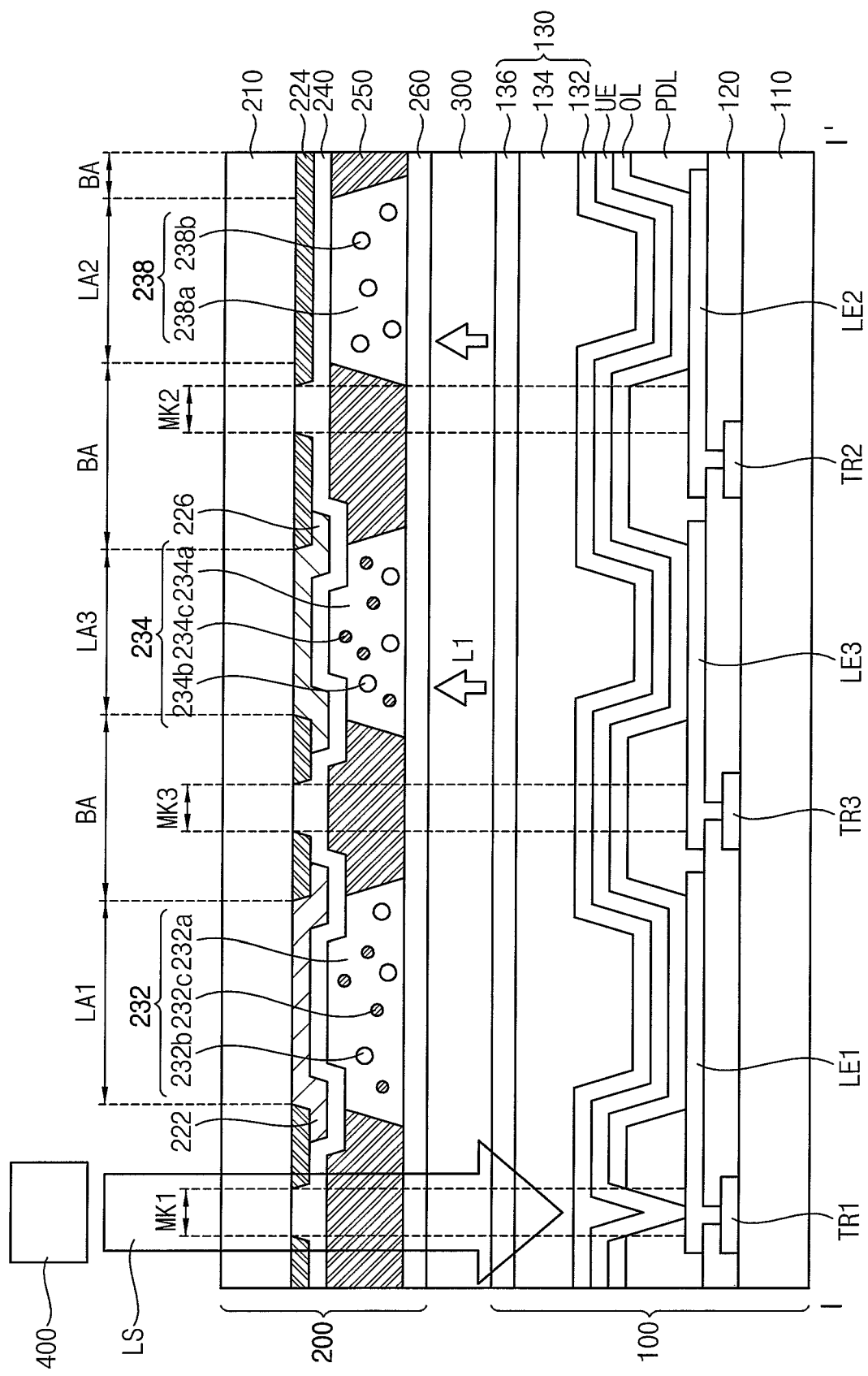
FIG. 3 is a cross-sectional view taken along the line I-I' of FIG. 1 illustrating a method for repairing a display device according to an exemplary embodiment of the present inventive concepts.

FIG. 1 is a plan view illustrating a display device according to an exemplary embodiment of the present inventive concepts. FIG. 1 may illustrate a pixel unit including a plurality of light-emitting areas that emit different color lights. FIG. 2 is a cross-sectional view taken along the line I-I' of FIG. 1 according to an exemplary embodiment of the present inventive concepts. FIG. 3 is a cross-sectional view illustrating a method for repairing a display device according to an exemplary embodiment of the present inventive concepts.

Referring to the exemplary embodiments of FIGS. 1 and 2, a display device may include a first substrate 100 and a second substrate 200. The first substrate 100 includes an array of pixels. Each pixel may include a light-emitting element, which generates a light in response to a driving signal, and a driving element, which drives the light-emitting element.

The second substrate 200 may include a color-converting layer that changes a wavelength of the light generated by the light-emitting element. Furthermore, the second substrate 200 may include a color filter transmitting a light having a specific color.

Referring to the exemplary embodiment of FIG. 1, the display device may include a display area generating an image and a peripheral area surrounding the display area. The display area may include a plurality of light-emitting areas. For example, as shown in the exemplary embodiment of FIG. 1 the display area may include a first light-emitting area LA1, a second light-emitting area LA2 and a third light-emitting area LA3 emitting a light. A light-blocking area BA surrounds the first to third light-emitting areas LA1, LA2 and LA3. The light generated in the display device may exit outwardly through the first to third light-emitting areas LA1, LA2 and LA3.

In an exemplary embodiment, the first to third light-emitting areas LA1, LA2 and LA3 may emit lights having different colors. For example, the display device may include a first light-emitting area LA1 emitting a first color light, a second light-emitting area LA2 emitting a second color light and a third light-emitting area LA3 emitting a third color light.

In an exemplary embodiment, the first light-emitting area LA1 may emit a red light, the second light-emitting area LA2 may emit a blue light, and the third light-emitting area LA3 may emit a green light. However, exemplary embodiments of the present inventive concepts are not limited thereto and the light emitted by the first to third light-emitting areas LA1, LA2, LA3 may vary. For example, the first to third light-emitting areas LA1, LA2, LA3 may be configured or combined to emit a yellow light, cyan light and a magenta light.

Furthermore, in other exemplary embodiments, the plurality of light-emitting areas may emit at least four color lights. For example, light-emitting areas may be configured or combined to emit at least one of a yellow light, cyan light and a magenta light in addition to a red light, a blue light and a green light. Furthermore, a plurality of light-emitting areas may be combined to further emit a white light or a light-emitting area may emit be configured to emit a white light.

In an exemplary embodiment, the plurality of light emitting areas may each have a substantially rectangular shape. However, exemplary embodiments of the present inventive concepts are not limited thereto. For example, in some exemplary embodiments, the plurality of light emitting areas may have different shapes from each other. Furthermore, in some exemplary embodiments, at least one of the plurality of light emitting areas may have various shapes, such as a square shape, a rhombus shape, a triangular shape, a circular shape or the like. An edge or a corner of each light emitting area may have a round shape or may be chamfered.

In an exemplary embodiment, at least some of the plurality of light emitting areas may have different sizes from each other (e.g., area in a plan view in a plane defined by the first direction D1 and the second direction D2). For example, in an exemplary embodiment, the first light-emitting area LA1 emitting a red light may have a larger size than the second light-emitting area LA2 emitting a blue light and the third light-emitting area LA3 emitting a green light. Furthermore, the third light-emitting area LA3 may have a larger size than the second light-emitting area LA2.

However, exemplary embodiments of the present inventive concepts are not limited thereto. For example, in some exemplary embodiments, each of the light emitting areas may have a same size.

Referring to the exemplary embodiment of FIG. 2, the first substrate 100 includes first to third driving elements TR1, TR2 and TR3 disposed on a first base substrate 110. The first to third driving elements TR1, TR2 and TR3 may be electrically connected to corresponding light-emitting elements, respectively. In an exemplary embodiment, the light-emitting element may be an organic light-emitting diode. For example, the organic light-emitting diode may include first to third lower electrodes LE1, LE2 and LE3, an upper electrode UE and an organic light-emitting layer OL disposed between the lower electrode LE, LE2 and LE3 and the upper electrode UE (e.g., in a thickness direction of the first base substrate 110). The first to third driving elements TR1, TR2 and TR3 may be electrically connected to the first to third lower electrodes LE1, LE2 and LE3 of the corresponding light-emitting elements, respectively. As shown in the exemplary embodiment of FIG. 2, the first to third lower electrodes LE1, LE2 and LE3 may be a pixel electrode having an isolated pattern shape, and the upper electrode UE may be a common electrode. However, exemplary embodiments of the present inventive concepts are not limited thereto.

In an exemplary embodiment, the first base substrate 110 may include at least one material selected from glass, quartz, sapphire, a polymeric material and the like. However, exemplary embodiments of the present inventive concepts are not limited thereto.

In an exemplary embodiment, the first to third driving element TR1, TR2, TR3 may include a thin film transistor. The driving element TR may include a plurality of thin film transistors.

For example, a channel layer of the thin film transistor may include at least one compound selected from amorphous silicon, multi-crystalline silicon (polysilicon), and a metal oxide. For example, the metal oxide may be a two-component compound (ABx), ternary compound (ABxCy) or four-component compound (ABxCyDz), which contains indium (in), zinc (Zn), gallium (Ga), tin (Sn), titanium (Ti), aluminum (Al), hafnium (Hf), zirconium (Zr) and/or magnesium (Mg). For example, the metal oxide may include at least one compound selected from zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (ZTO), indium-gallium-hafnium oxide (IGHO), tin-aluminum-zinc oxide (TAZO), indium-gallium-tin oxide (IGTO) and the like.

The first to third driving elements TR1, TR2 and TR3 may be covered by an insulation structure 120. In an exemplary embodiment, the insulation structure 120 may include a combination of an inorganic insulation layer and an organic insulation layer.

The first to third lower electrodes LE1, LE2 and LE3 may function as an anode. For example, the first to third lower electrodes LE1, LE2 and LE3 may be formed as a transmitting electrode or a reflecting electrode according to an emission type of the display device (a front emission type or a rear emission type). In exemplary embodiments in which the first to third lower electrodes LE1, LE2 and LE3 are reflecting electrodes, the first to third lower electrodes LE1, LE2 and LE3 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including a metal oxide layer including at least compound selected from indium tin oxide, indium zinc oxide, zinc tin oxide, indium oxide, zinc oxide, tin oxide and the like.

The pixel-defining layer PDL is disposed on the insulation structure 120, and has openings overlapping at least a portion of the first to third lower electrodes LE1, LE2 and LE3, respectively. In an exemplary embodiment, the pixel-defining layer PDL may include an organic insulating material. At least a portion of the organic light-emitting layer OL may be disposed in the openings of the pixel-defining layer PDL. As shown in the exemplary embodiment of FIG. 2, the organic light-emitting layer OL may extend continuously over a plurality of pixels in the display area. However, exemplary embodiments of the present inventive concepts are not limited thereto. For example, in another exemplary embodiment, the organic light-emitting layer OL may be formed as discrete patterns in which organic light-emitting layers of adjacent pixels are separated from each other.

The organic light-emitting layer OL may include at least a light-emitting layer, and may further include at least one of a hole injection layer (HIL), a hole transporting layer (HTL), an electron transporting layer (ETL) and an electron injection layer (EIL). For example, in an exemplary embodiment, the organic light-emitting layer OL may include a low molecular weight organic compound or a high molecular weight organic compound.

In an exemplary embodiment, the organic light-emitting layer OL may generate a blue light. However, exemplary embodiments of the present inventive concepts are not limited thereto. For example, in another exemplary embodiment, the organic light-emitting layer OL may generate a red light, a green light, etc. In another exemplary embodiment, the organic light-emitting layer OL may generate lights having different colors in different pixels.

The upper electrode UE may be formed as a transmitting electrode or a reflecting electrode according to an emission type of the display device. For example, in an exemplary embodiment, the upper electrode UE may include a metal, a metal alloy, a metal nitride, a metal fluoride, a conductive metal oxide or a combination thereof. For example, as shown in the exemplary embodiment of FIG. 2, the upper electrode UE may be formed as a common layer extending continuously over a plurality of pixels in the display area. However, exemplary embodiments of the present inventive concepts are not limited thereto.

The first substrate 100 may further include an encapsulation layer 130 covering light-emitting elements. The encapsulation layer 130 may extend to cover an entire portion of the display area.

For example, the encapsulation layer 130 may have a stacked structure of at least one inorganic thin film and an organic thin film. For example, as shown in the exemplary embodiment of FIG. 2, the encapsulation layer 130 may include a first inorganic thin film 132, an organic thin film 134 disposed on the first inorganic thin film 132, and a second inorganic thin film 136 disposed on the organic thin film 134. However, exemplary embodiments of the present inventive concepts are not limited thereto. For example, in another exemplary embodiment, the encapsulation layer 130 may have a structure including at least two organic thin films and at least three inorganic thin films.

In an exemplary embodiment, the organic thin film 134 includes a cured resin such as at least one compound selected from a polyacrylate resin, an epoxy resin and the like. For example, the cured resin may be formed from cross-linking reaction of monomers. For example, the first and second inorganic thin films 132 and 136 may include an inorganic material such as at least one compound selected from silicon oxide, silicon nitride, silicon carbide, aluminum oxide, tantalum oxide, hafnium oxide, zirconium oxide, titanium oxide and the like.

The second substrate 200 includes a color-converting layer. The color-converting layer changes a wavelength of a light L1 generated by the light-emitting element of the first substrate 100, and emits a light having a color different from the incident light L1 (e.g., light incident thereon from the organic light-emitting layer OL).

Furthermore, the second substrate 200 includes a color filter layer overlapping the color-converting layer. For example, as shown in the exemplary embodiment of FIG. 2, the color filter layer may be disposed between a second base substrate 210 and the color-converting layer (e.g., in a thickness direction of the second base substrate 210). The color filter layer filters a light passing through the color filter to transmit a light having a specific color.

As shown in the exemplary embodiment of FIG. 2, the color filter layer may include a first color filter 222, a second color filter 224 and a third color filter 226. The color filters may overlap corresponding light-emitting areas. Therefore, a color of lights exiting from the first to third light-emitting areas LA1, LA2 and LA3 may be determined by the color filters.

In an exemplary embodiment, the first color filter 222 overlaps the first light-emitting area LA1 (e.g., in a thickness direction of the second base substrate 210). For example, as shown in the exemplary embodiment of FIG. 2, the first color filter 222 may selectively transmit a red light L2R. The second color filter 224 overlaps the second light-emitting area LA2 (e.g., in a thickness direction of the second base substrate 210). As shown in the exemplary embodiment of FIG. 2, the second color filter 224 may selectively transmit a blue light L2B. The third color filter 226 overlaps the third light-emitting area LA3 (e.g., in a thickness direction of the second base substrate 210). As shown in the exemplary embodiment of FIG. 2, the third color filter 226 may selectively transmit a green light.

The second color filter 224 may include a transmitting portion, which overlaps the second light-emitting area LA2, and a light-blocking portion overlapping the light-blocking area BA. As shown in the exemplary embodiment of FIG. 2, the light-blocking portion of the second color filter 224 may be formed to entirely overlap the light-blocking area BA. The light-blocking portion of the second color filter 224 may function as a light-blocking member blocking a light having a different color from the light transmitted by the second color filter 224.

In an exemplary embodiment, the second color filter 224 may have openings overlapping the first light-emitting area LA1 and the third light-emitting area LA3. The second color filter 224 may partially overlap the first color filter 222 and the third color filter 226.

The second substrate 200 may include a first protective layer 240 covering the color filter layer. In an exemplary embodiment, the first protective layer 240 may include an inorganic material such as at least one compound selected from silicon oxide, silicon nitride and the like.

The color-converting layer overlaps a corresponding light-emitting area (e.g., in a thickness direction of the second base substrate 210). For example, as shown in the exemplary embodiment of FIG. 2, the second substrate 200 may include a first color-converting layer 232 overlapping the first light-emitting area LA1.

The first color-converting layer 232 may include a wavelength-converting material. For example, the first color-converting layer 232 may include a resin part 232a, scattering particles 232b and wavelength-converting particles 232c.

In an exemplary embodiment, the wavelength-converting particle 232c may include a quantum dot. The quantum dot may be defined as a nano-crystalline semiconductor material. The quantum dot may absorb an incident light and emit a light having a wavelength different from the incident light. For example, in an exemplary embodiment, the quantum dot may have a diameter less than or equal to about 100 nm. For example, the quantum dot may have a diameter in a range of about 1 nm to about 20 nm.

In an exemplary embodiment, the quantum dot may include a II-VI group compound, a III-V group compound, a IV-VI group compound, a IV group element, a IV group compound or a combination thereof.

For example, the II-VI group compound may include a binary compound selected from CdSe, CdTe, ZnS, ZnSe, ZnTe, ZnO, HgS, HgSe, HgTe, MgSe, MgS and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe and a combination thereof.

For example, the III-V group compound may include a binary compound selected from GaN, GaP, GaAs, GaSb, AlN, AlP, AlAs, AlSb, InN, InP, InAs, InSb and a combination thereof, a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof, or a quaternary compound selected from GaAlNAs, GaANSb, GaAPAs, GaAlPSb, GaInNP, GaInNAs, GaInNSb, GaInPAs, GaInPSb, InAlNP, InANAs, InANSb, InAlPAs, InAlPSb and a combination thereof.

For example, the IV-VI group compound may include a binary compound selected from SnS, SnSe, SnTe, PbS, PbSe, PbTe and a combination thereof, a ternary compound selected from SnSeS, SnSeTe, SnSTe, PbSeS, PbSeTe, PbSTe, SnPbS, SnPbSe, SnPbTe and a combination thereof, or a quaternary compound selected from SnPbSSe, SnPbSeTe, SnPbSTe and a combination thereof.

For example, the IV group element may include Si, Ge or a combination thereof. The IV group compound may include a binary compound selected from SiC, SiGe and a combination thereof.

In an exemplary embodiment, the quantum dot may have a core-shell structure including a core and a shell which surrounds the core. In an exemplary embodiment, the core and the shell may include different materials. However, exemplary embodiments of the present inventive concepts are not limited thereto.

For example, the wavelength-converting particles 232c may be dispersed in the resin part 232a. For example, the resin part 232a may include at least one material selected from an epoxy resin, an acrylic resin, a phenolic resin, a melamine resin, a cardo resin, an imide resin and the like.

The scattering particles 232b may scatter an incident light without substantially changing a wavelength of the incident light.

In an exemplary embodiment, the scattering particles 232b may include a metal oxide or an inorganic material. For example, the metal oxide may include at least one compound selected from titanium oxide, zirconium oxide, aluminum oxide, indium oxide, zinc oxide, tin oxide and the like. For example, the organic material may include an acrylic resin, an urethane resin and the like.

For example, a light-emitting diode corresponding to the first light-emitting area LA may generate a blue light L1 having a peak in a range of about 440 nm to about 480 nm. The first color-converting layer 232 changes a wavelength of the blue light L1 incident thereon to emit a red light. A remainder of the blue light L1, which is not changed into red light in the first color-converting layer 232, is blocked by the first color filter 222. Therefore, the first light-emitting area LA1 may selectively emit a red light L2R. In an exemplary embodiment, the red light L2R may have a peak in a range of about 610 nm to about 650 nm.

The second substrate 200 may further include a second color-converting layer 234 overlapping the third light-emitting area LA3. The second color-converting layer 234 may include a resin part 234a, scattering particles 234b and wavelength-converting particles 234c.

For example, a light-emitting diode corresponding to the third light-emitting area LA3 may generate a blue light L1. The second color-converting layer 234 changes a wavelength of the blue light L1 incident thereon to emit a green light. A remainder of the blue light L1, which is not changed into green light in the second color-converting layer 234, is blocked by the third color filter 226. Therefore, the third light-emitting area LA3 may selectively emit a green light L2G. In an exemplary embodiment, the green light L2G may have a peak in a range of about 510 nm to about 550 nm.

The second substrate 200 may further include a compensation layer 238 overlapping the second light-emitting area LA2. The compensation layer 238 may not include a wavelength-converting material. Therefore, the blue light L1 entering the compensation layer 238 may pass through the compensation layer 238 to enter the second color filter 224 without substantially changing a color thereof. Therefore, the second light-emitting area LA2 may emit a blue light L2B.

As shown in the exemplary embodiment of FIG. 2, the compensation layer 238 may include a resin part 238a and scattering particles 238b. For example, the resin part 238a may include a same material as the resin parts 232a and 234a of the first and second color-converting layers 232 and 234.

The second substrate 200 includes a partition wall 250 surrounding the first and second color-converting layers 232 and 234 and the compensation layer 238 in a plan view (e.g., in a plane defined by the first direction D1 and second direction D2 which are both parallel to a surface of the second base substrate 210). The partition wall 250 may form a space receiving an ink composition for forming the first and second color-converting layers 232 and 234 and the compensation layer 238. Therefore, the partition wall 250 may have a grid shape or a matrix shape, in a plan view.

In an exemplary embodiment, the partition wall 250 may include an organic material such as at least one material selected from an epoxy resin, a phenolic resin, an acrylic resin, a silicone resin and the like.

In an exemplary embodiment, the partition wall 250 may include a light-blocking material to function as a black matrix. For example, at least a portion of the partition wall 250 may include a light-blocking material such as a pigment, a dye, a carbon black or the like. For example, as shown in the exemplary embodiment of FIG. 2, the partition wall 250 may substantially overlap an entire portion of the light-blocking area BA (e.g., in a thickness direction of the second base substrate 210). Therefore, the partition wall 250 may function as a light-blocking member defining the light-emitting areas LA1, LA2 and LA3.

The second substrate 200 may include a second protective layer 260 covering the first and second color-converting layers 232 and 234, the compensation layer 238 and the partition wall 250. In an exemplary embodiment, the second protective layer 260 may include an inorganic material such as at least one compound selected from silicon oxide, silicon nitride and the like.

A filling member 300 may be disposed between the first substrate 100 and the second substrate 200. For example, as shown in the exemplary embodiment of FIG. 2, a bottom surface of the filling member 300 may directly contact an upper surface of the second inorganic thin film 136 and an upper surface of the filling member 300 may directly contact lower surfaces of the partition wall 250, the first and second color-converting layers 232, 234, and the compensation layer 238. In an exemplary embodiment, the filling member 300 may include an organic material such as at least one material selected from a silicone resin, an epoxy resin and the like. Furthermore, the filling member 300 may include a suitable material for matching a refractive index.

The light-emitting elements are configured to emit a light having a predetermined brightness based on a driving current provided by the driving elements. During the manufacturing process of the display device, contamination or impurities may cause defects of the light-emitting elements or the driving elements. A defective pixel may be perceived as a dark spot or a bright spot.

According to exemplary embodiments of the present inventive concepts, a display device may be inspected for detecting a defective pixel after the display device is manufactured. The defective pixel may be detected by a conventional method. For example, a laser may be irradiated onto a light-emitting element of a defective pixel to cause a short between a lower electrode and an upper electrode of the light-emitting diode. Therefore, an electric current does not flow through an organic light-emitting layer between the lower electrode and the upper electrode. Accordingly, the defective pixel is changed into a dark spot.

In an exemplary embodiment, a laser may be irradiated onto the light-emitting element through the second substrate 200. When the laser passes through the first substrate 100 having circuits, the metal wirings may cause interference or the circuits may be damaged.

The laser may be irradiated onto an area where the lower electrode and the upper electrode overlap each other to induce a short between the lower electrode and the upper electrode. For example, the lower electrode and the upper electrode may overlap each other in a light-emitting area. However, since a wavelength-converting particle or a scattering particle is disposed in the light-emitting area, the laser passing through the light-emitting area may be scattered thereby causing damage to normal pixels adjacent to the defective pixel.

According to exemplary embodiments, when a display device is repaired, a laser is irradiated onto a defective pixel through a light-blocking area, which does not include a wavelength-converting particle or a scattering particle. Therefore, damage to the normal pixels (e.g., non-defective pixels) by scattered laser may be prevented.

Accurately irradiating a laser in an area where the lower electrode and the upper electrode overlap each other may be preferred to effectively and reliably perform the repairing process. However, the area where the lower electrode and the upper electrode overlap each other in the light-blocking area may be relatively small. Therefore, accurately identifying the area may be difficult without a marker.

In an exemplary embodiment, the display device may include a marking area disposed in a light-blocking area BA for identifying the area where the lower electrode and the upper electrode overlap each other. The marking area overlaps the lower electrode and the upper electrode without overlapping the light-emitting areas.

For example, as shown in the exemplary embodiment of FIG. 2, a first marking area MK1 overlaps a first lower electrode LE1 overlapping the first light-emitting area LA. A second marking area MK2 overlaps a second lower electrode LE2 overlapping the second light-emitting area LA2. A third marking area MK3 overlaps a third lower electrode LE3 overlapping the third light-emitting area LA3. Therefore, the first to third marking areas MK1 to MK3 are disposed in the light-blocking area BA adjacent to the first to third light-emitting areas LA1, LA2, LA3, respectively. The upper electrode UE overlaps each of the first to third marking areas MK1, MK2 and MK3 since the upper electrode UE is a common electrode.

The first to third marking areas MK1, MK2 and MK3 may have a reflective characteristic to an external light, which is different from a reflective characteristic of a remaining portion of the light-blocking area BA adjacent to the first to third marking areas MK1, MK2 and MK3. As shown in the exemplary embodiment of FIG. 2, the second color filter 224 may have openings overlapping the marking areas MK1, MK2 and MK3.

For example, in an exemplary embodiment, the reflective characteristic to an external light in the light-blocking area BA may be determined mainly by the second color filter 224 or a combination of the second color filter 224 and the partition wall 250 thereunder. For example, in the exemplary embodiment of FIG. 2, since the second color filter 224 is removed in the first to third marking areas MK1, MK2 and MK3, the reflective characteristic to an external light in the first to third marking areas MK1, MK2 and MK3 may be determined mainly by the partition wall 250.

Therefore, positions of the first to third marking areas MK1, MK2 and MK3 may be accurately detected or identified by using the reflective characteristic differences to external lights reflected in the first to third marking areas MK1, MK2 and MK3.

For example, as illustrated in the exemplary embodiment of FIG. 3, when a defective pixel corresponds to the first light-emitting area LA1, a laser LS from a laser apparatus 400 or the like may be irradiated onto the first marking area MK1. The first marking area MK1 overlaps the first lower electrode LE1 and the upper electrode UE. Therefore, a short between the first lower electrode LE1 and the upper electrode UE may be caused by the laser LS.

Examples of the laser may include various lights, which may be used for causing a short of electrodes. For example, in an exemplary embodiment, the laser may include UV laser, JR laser, YAG laser, Femto laser or the like. In an exemplary embodiment, a long-wavelength laser such as IR laser may be used. For example, in an exemplary embodiment, the long-wavelength laser may use a light having a wavelength greater than or equal to about 800 nm. The long-wavelength laser may be advantageous for transferring energy to a long-distance spot.

Figure 4:
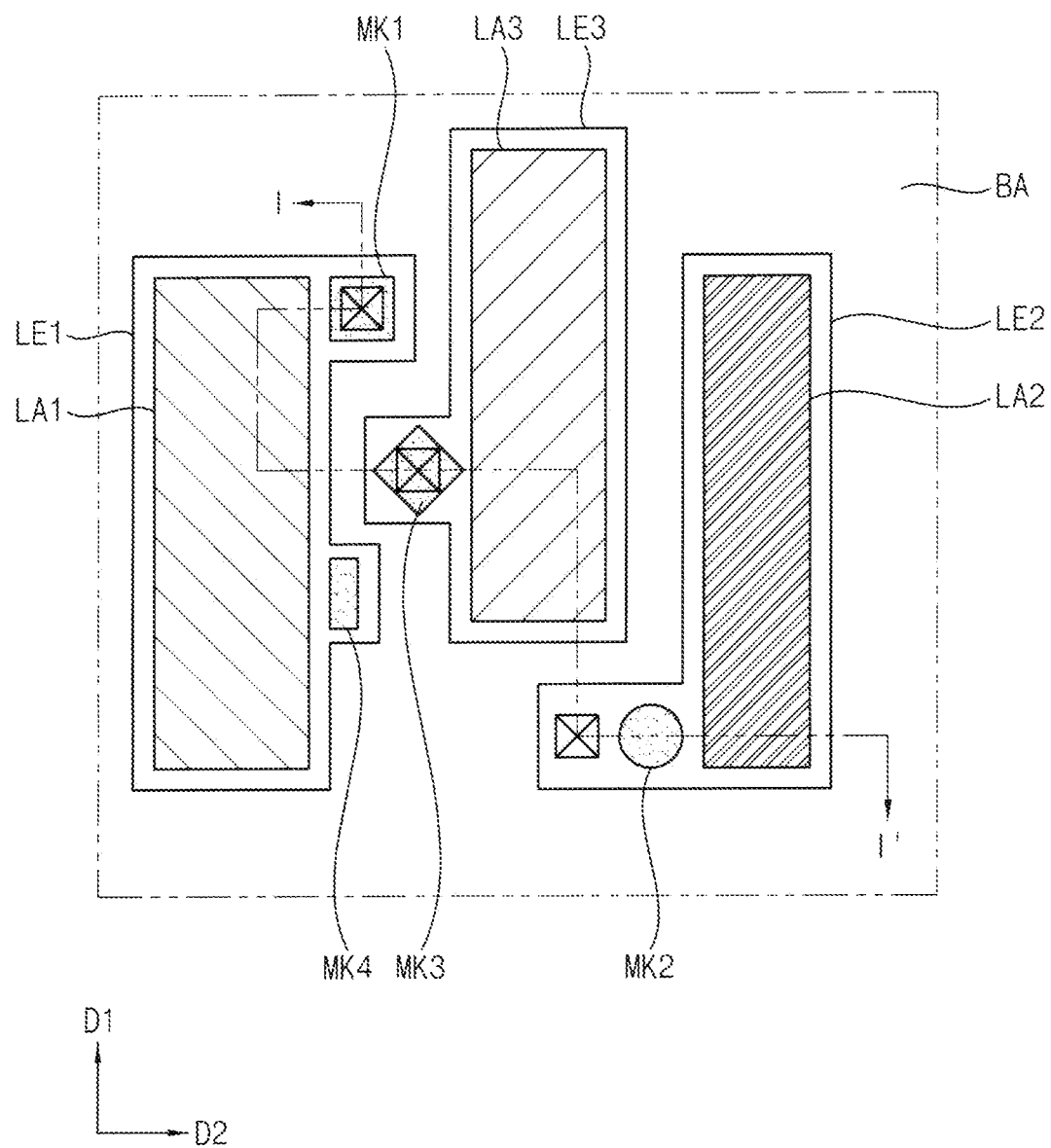
FIG. 4 is a plan view illustrating a display device according to an exemplary embodiment of the present inventive concepts.

Referring to the exemplary embodiment of FIG. 1, the first to third marking areas MK1, MK2 and MK3 may have a square shape in a plan view defined by the first direction D1 and the second direction D2. However, exemplary embodiments of the present inventive concepts are not limited thereto. For example, in another exemplary embodiment, at least one of the first to third marking areas MK1, MK2 and MK3 may have a circular shape, an oval shape, a polygonal shape such as a rectangular shape, a rhombus shape, a triangular shape, or the like. For instance, as shown in the exemplary embodiment of FIG. 4, the first marking area MK1 may be a square shape, the second marking area MK2 may be a circular shape, the third marking area may be a rhombus shape and a fourth marking area MK4 may be a rectangular shape. Furthermore, the first to third marking areas MK1, MK2 and MK3 may have different shapes or different sizes from each other to increase identifying accuracy or to distinguish pixels having different colors.

Referring to the exemplary embodiment of FIG. 1, a first and third marking area MK1 and MK3 may overlap a contact area of a corresponding first and third lower electrode LE1 and LE3 and a corresponding first and third driving element TR1 and TR3. A second marking area MK2 may be disposed between the second light-emitting area and a contact area of the second lower electrode LE2 and the corresponding second driving element TR2 (e.g., in the second direction D2). However, exemplary embodiments of the present inventive concepts are not limited thereto. For example, as illustrated in the exemplary embodiment of FIG. 4, a fourth marking area MK4 may be spaced apart from a contact area.

Figure 5:
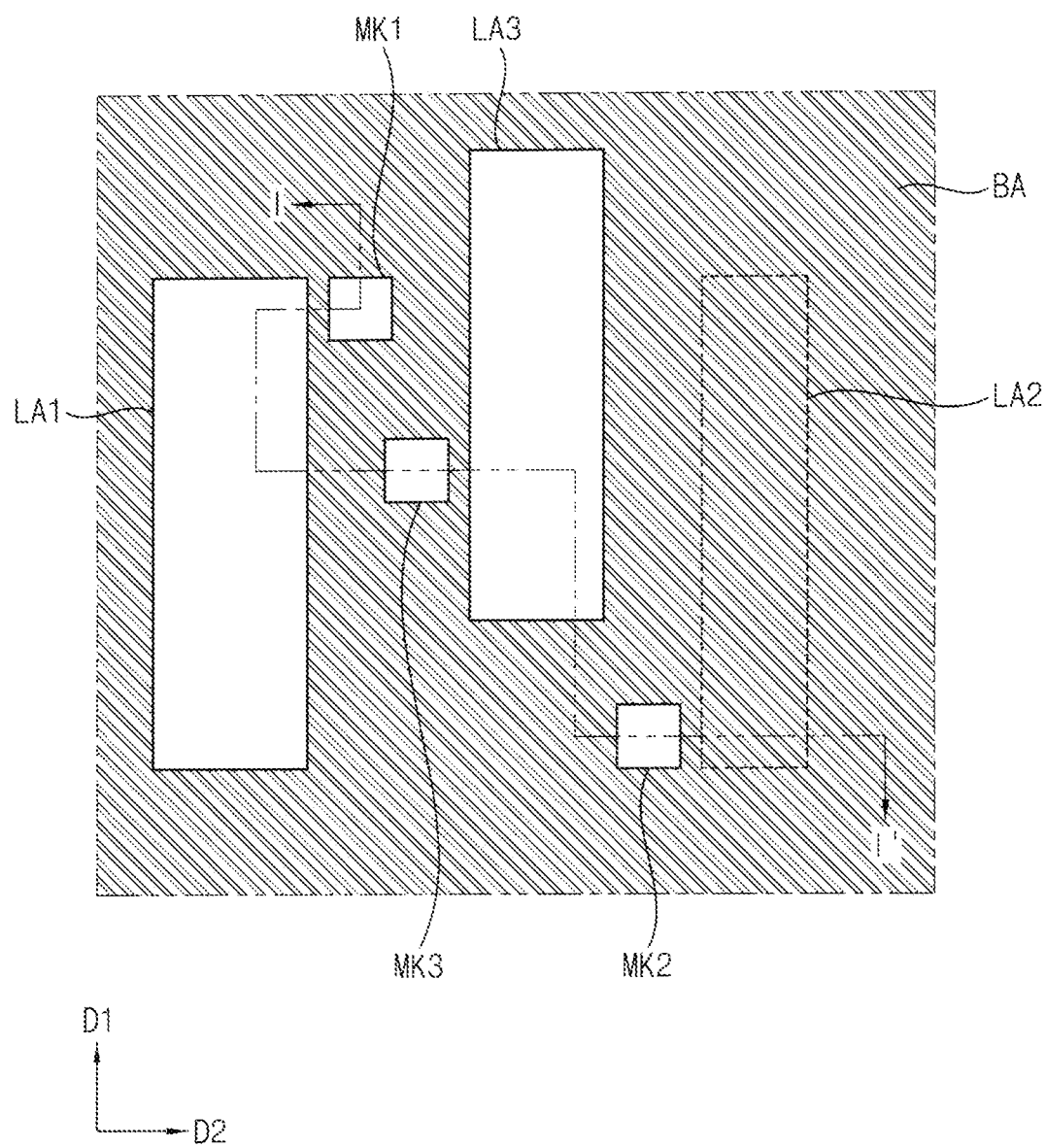
FIGS. 5, 7 and 9 are plan views illustrating a method for manufacturing a color-converting substrate of a display device according to exemplary embodiments of the present inventive concepts.
Figure 6:
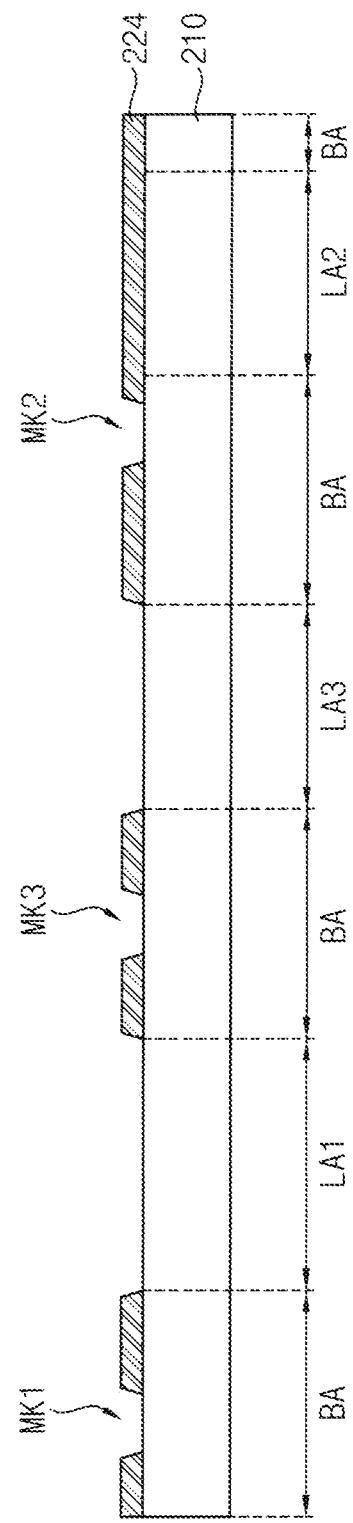
FIGS. 6, 8 and 10-12 are cross-sectional views illustrating a method for manufacturing a color-converting substrate of a display device according to exemplary embodiments of the present inventive concepts.
Figure 7:
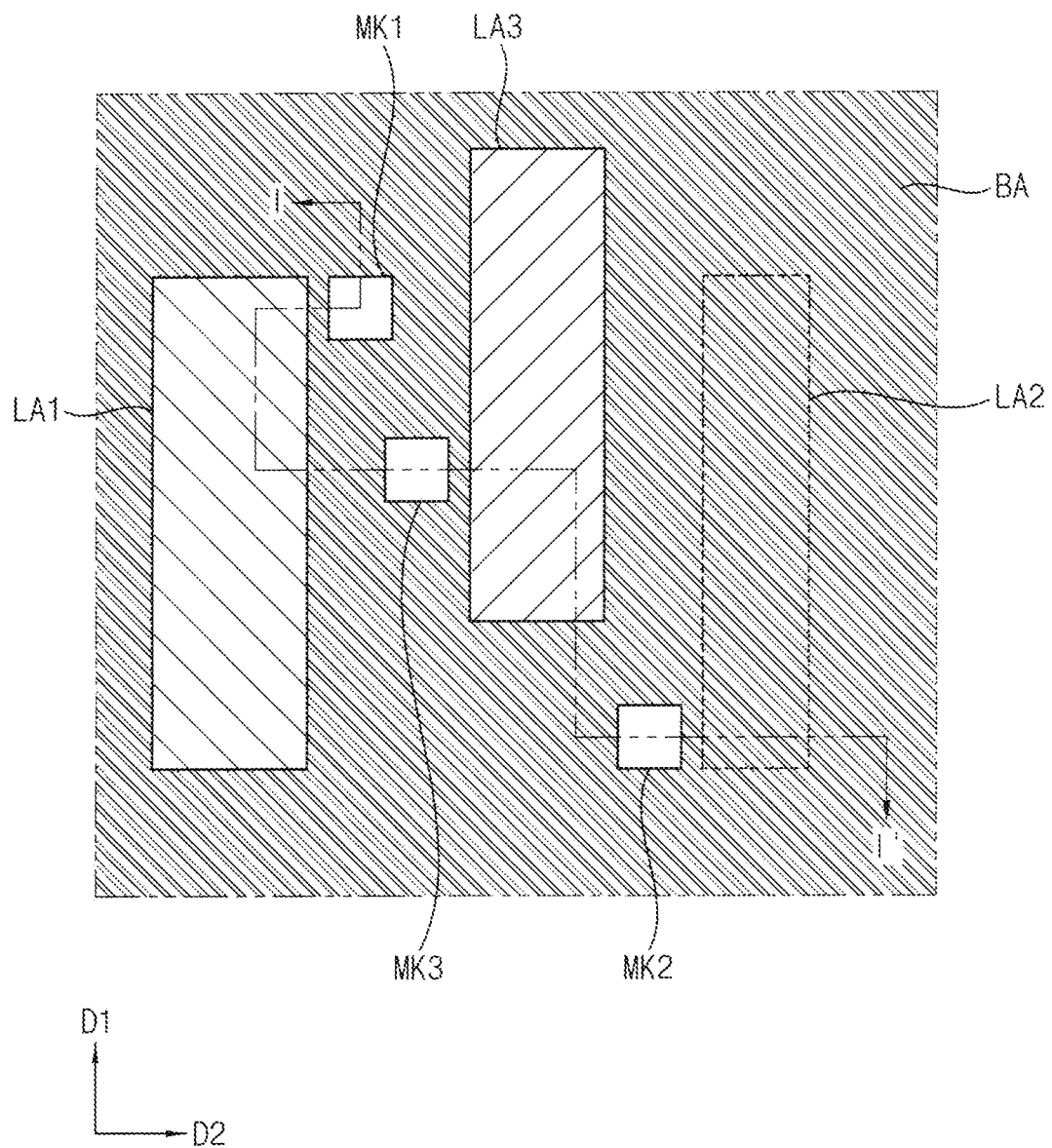
Figure 8:
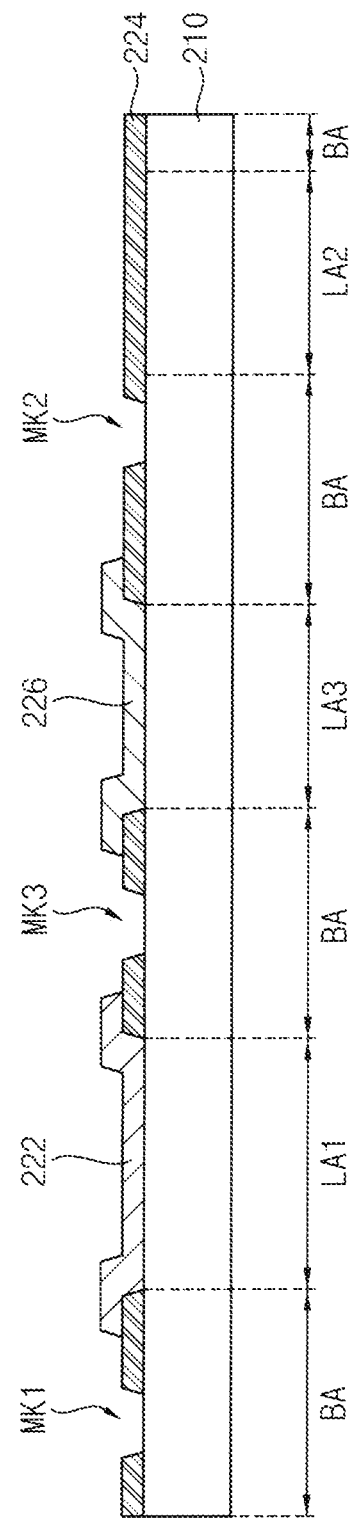
Figure 9:
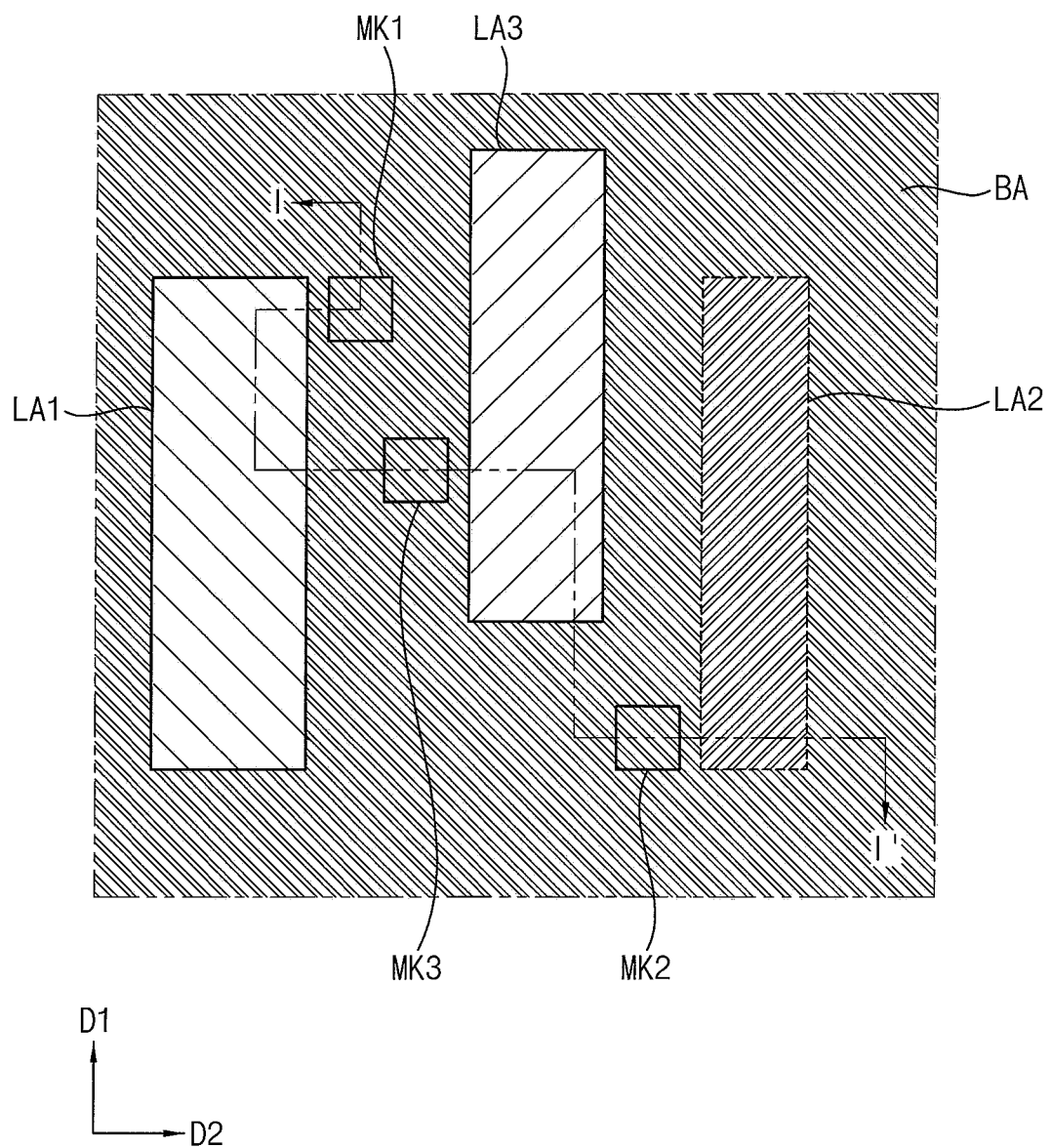

FIGS. 5 to 12 are cross-sectional views and plan views, which illustrate a method for manufacturing a color-converting substrate of a display device according to exemplary embodiments of the present inventive concepts. FIGS. 5, 7 and 9 are plan views illustrating a method for manufacturing a color-converting substrate of a display device according to exemplary embodiments of the present inventive concepts. FIGS. 6, 8, 10, 11 and 12 are cross-sectional views taken along the line I-I' of FIGS. 5, 7 and 9 according to exemplary embodiments of the present inventive concepts.

Referring to the exemplary embodiments of FIGS. 5 and 6, a second color filter 224 is formed on a second base substrate 210. The second color filter 224 may overlap a second light-emitting area LA2. The second color filter 224 may also overlap a light-blocking area BA adjacent to the first to third light-emitting areas LA1, LA2 and LA3. Furthermore, the second color filter 224 may include openings overlapping the first light-emitting area LA1 and the third light-emitting area LA3. The second color filter 224 may also include openings overlapping to a first marking area MK1, a second marking area MK2 and a third marking area MK3.

In an exemplary embodiment, the second color filter 224 may be a blue filter selectively transmitting a blue light. For example, the second color filter 224 may be formed from a color filter composition including a blue pigment and/or a blue dye.

Referring to the exemplary embodiments of FIGS. 7 and 8, a first color filter 222 and a third color filter 226 are formed on the second base substrate 210.

The first color filter 222 overlaps the first light-emitting areas LA1.

In an exemplary embodiment, the first color filter 222 may be a red filter selectively transmitting a red light. For example, the first color filter 222 may be formed from a color filter composition including a red pigment and/or a red dye.

The third color filter 226 overlaps the third light-emitting areas LA3.

In an exemplary embodiment, the third color filter 226 may be a green filter selectively transmitting a green light. For example, the third color filter 226 may be formed from a color filter composition including a green pigment and/or a green dye.

An order of forming the color filters and position thereof are not limited to those illustrated in the exemplary embodiments. For example, in other exemplary embodiments, the first color filter 222 and/or the third color filter 226 may be formed prior to the second color filter 224 so that the first color filter 222 and/or the third color filter 226 may be disposed between the second color filter 224 and the second base substrate 210.

Figure 10:
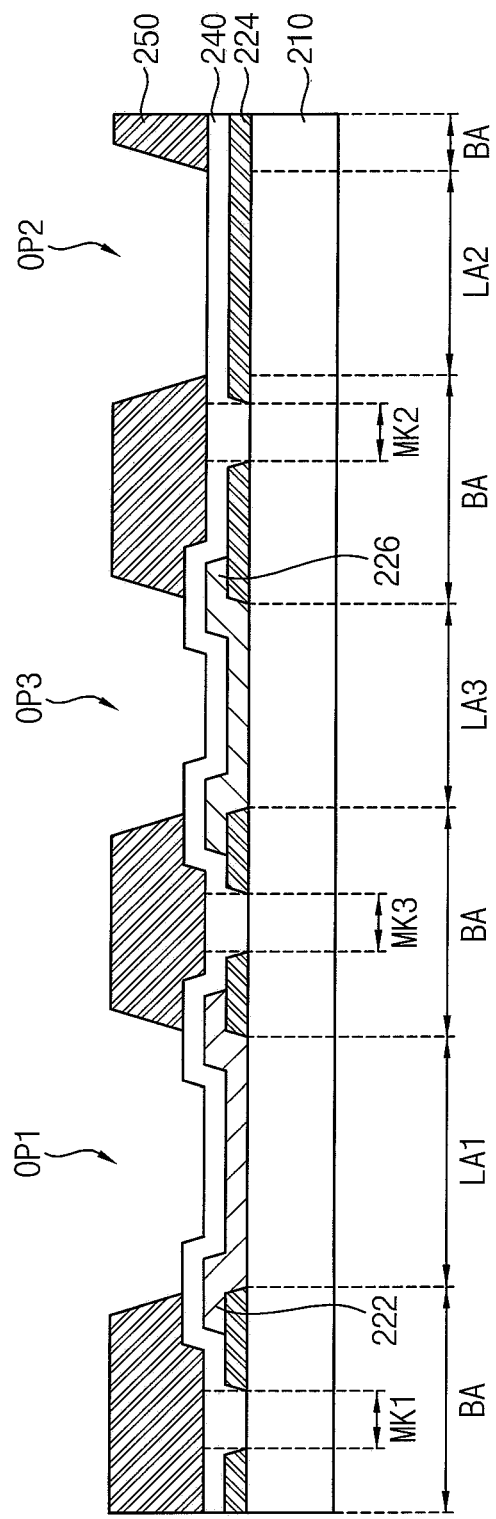
Figure 11:
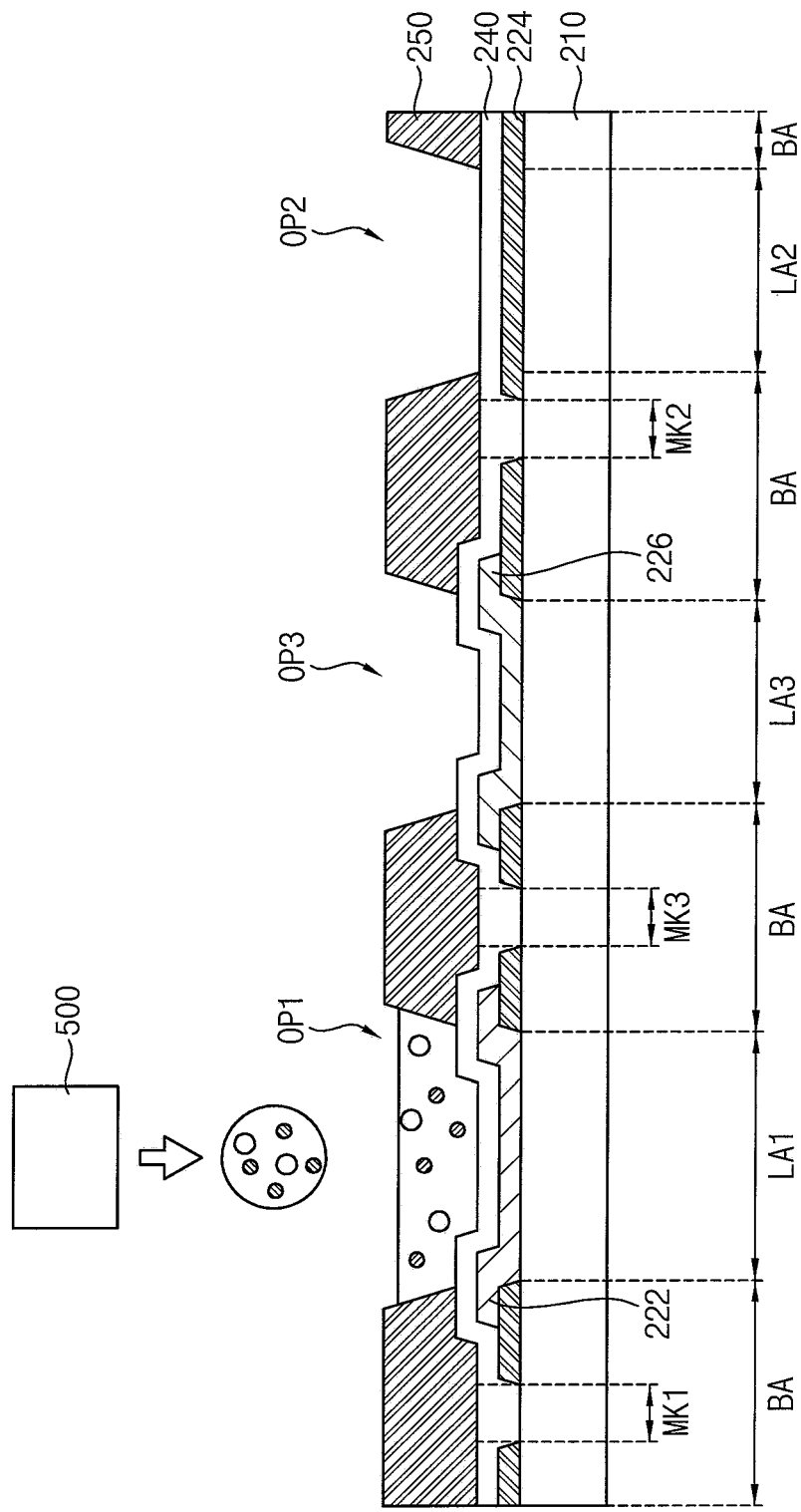

Referring to the exemplary embodiments of FIGS. 9 and 10, a first protective layer 240 is formed to cover the color filters. However, exemplary embodiments of the present inventive concepts are not limited thereto and the first protective layer 240 may be omitted in some exemplary embodiments. A partition wall 250 is formed on the first protective layer 240.

As shown in the exemplary embodiments of FIGS. 9-10, the partition wall 250 may entirely overlap the light-blocking area BA. The partition wall 250 may include receiving areas overlapping the first to third light-emitting areas LA1, LA2 and LA3. In an exemplary embodiment, the partition wall 250 may overlap the first to third marking areas MK1, MK2 and MK3.

For example, the partition wall 250 may include a first receiving area OP1 overlapping the first light-emitting area LA1, a second receiving area OP2 overlapping the second light-emitting area LA2, and a third receiving area OP3 overlapping the third light-emitting area LA3.

Figure 12:
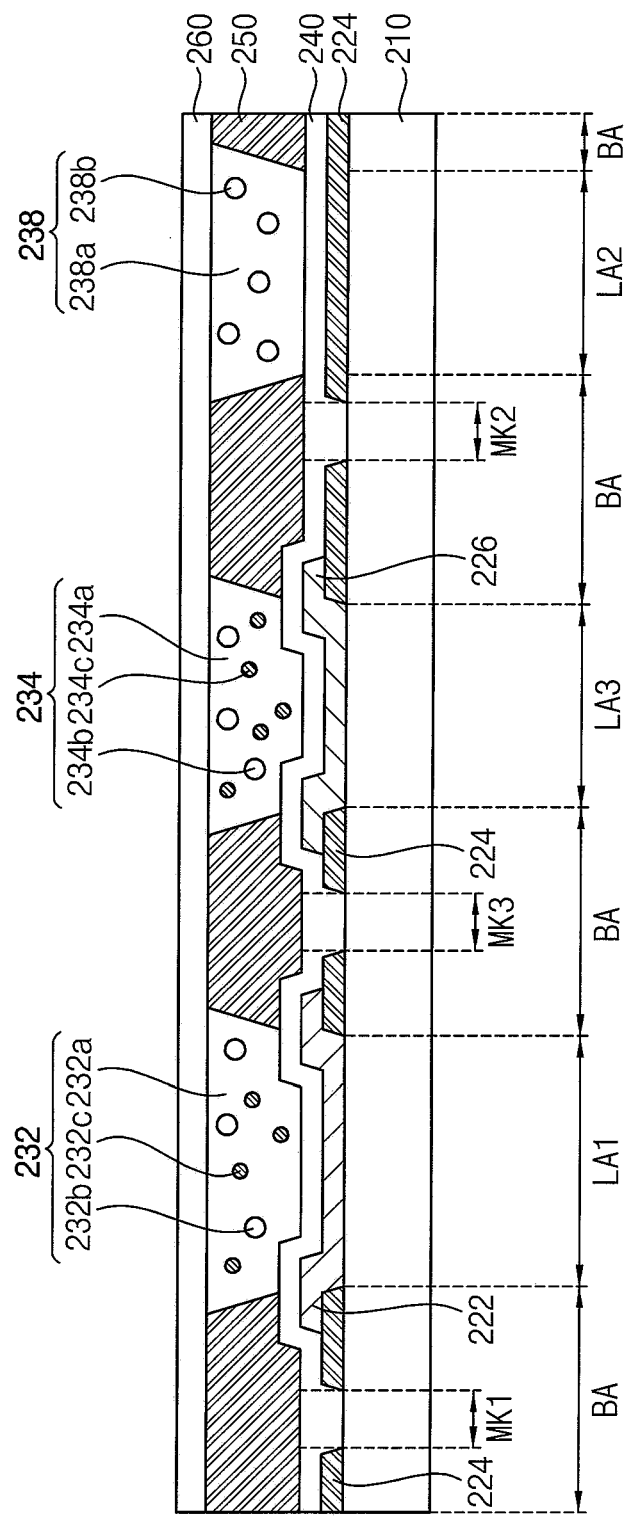

Referring to the exemplary embodiments of FIGS. 1 and 12, first and second color-converting layers 232 and 234 and a compensation layer 238 are formed in the first to third receiving areas OP, OP2 and OP3 of the partition wall 250. For example, in an exemplary embodiment, an ink may be dropped in the first to third receiving areas OP1, OP2 and OP3 and dried or cured to form the first and second color-converting layers 232 and 234 and the compensation layer 238.

For example, an inkjet printing apparatus may be used for dropping the ink. As shown in the exemplary embodiment of FIG. 11, The inkjet printing apparatus may include at least one nozzle 500.

The inkjet printing apparatus may provide an ink composition in the first to third receiving areas OP1, OP2 and OP3 of the partition wall 250 through the nozzles 500. For example, the inkjet printing apparatus may drop a first composition in the first receiving area OP1, drop a second composition in the second receiving area OP2, and drop a third composition in the third receiving area OP3.

In an exemplary embodiment, the first and third compositions may include a wavelength-converting material. For example, the first and third compositions may include a wavelength-converting particle, a binder component and a solvent.

For example, the wavelength-converting particle may include a quantum dot. In an exemplary embodiment, the first composition may include a quantum dot that emits a red light, and the third composition may include a quantum dot that emits a green light. The quantum dots may include an organic ligand combined with a surface thereof.

In an exemplary embodiment, the binder component may include a polymer, a polymerizable monomer or a combination thereof. For example, the polymer may include an aromatic ring structure in a main chain thereof. For example, the aromatic ring structure may include a phenylene group, a biphenylene group, a fluorene or the like. The polymerizable monomer may contain at least one double bond between carbon atoms. For example, the polymerizable monomer may include a (meth)acrylate compound.

The solvent may be properly selected or combined from known materials based on a compatibility with other components, a dispersion of a quantum dot, a viscosity, a boiling point or the like.

In an exemplary embodiment, the first and third compositions may further include scattering particles, a photo-initiator, a polymer stabilizer, a leveling agent, a coupling agent or a combination thereof.

The second composition may include a same material as the first and third compositions except for the wavelength-converting particle. For example, the second composition may include a binder component and a solvent, and may further include scattering particles, a photo-initiator, a polymer stabilizer, a leveling agent, a coupling agent or a combination thereof.

The inkjet printing apparatus provide ink drops including a corresponding composition in the first to third receiving areas OP1, OP2 and OP3. Therefore, the first to third receiving areas OP1, OP2 and OP3 may be filled with the corresponding composition.

The compositions provided in the first to third receiving areas OP1, OP2 and OP3 may be dried or cured to form the first and second color-converting layers 232 and 234 and the compensation layer 238. For example, the compositions may be cured by heat and/or light.

A second protective layer 260 is formed to cover the first and second color-converting layers 232 and 234 and the compensation layer 238.

The color-converting substrate may be combined with an array substrate including an array of light-emitting elements. The first to third marking areas MK1, MK2 and MK3 may overlap a lower electrode of a corresponding light-emitting element.

Figure 13:
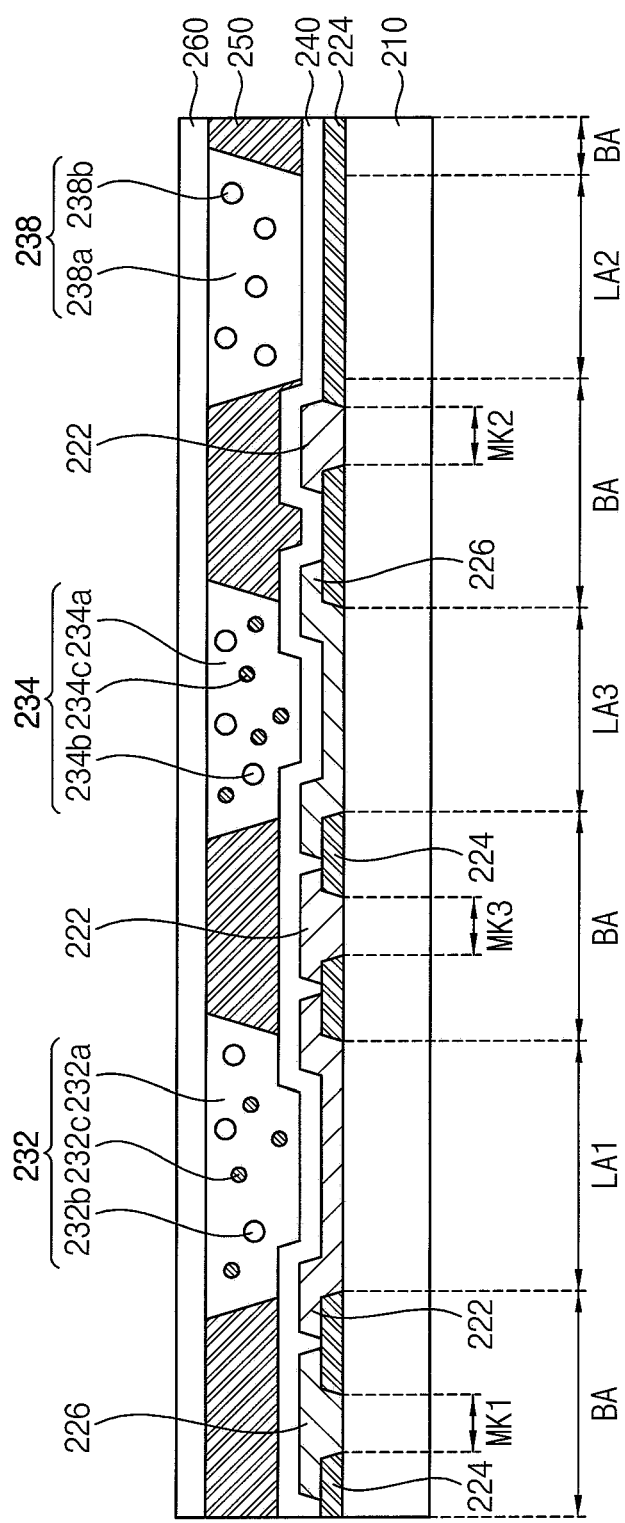
FIGS. 13 and 14 are cross-sectional views illustrating a color-converting substrate of a display device according to exemplary embodiments of the present inventive concepts.
Figure 14:
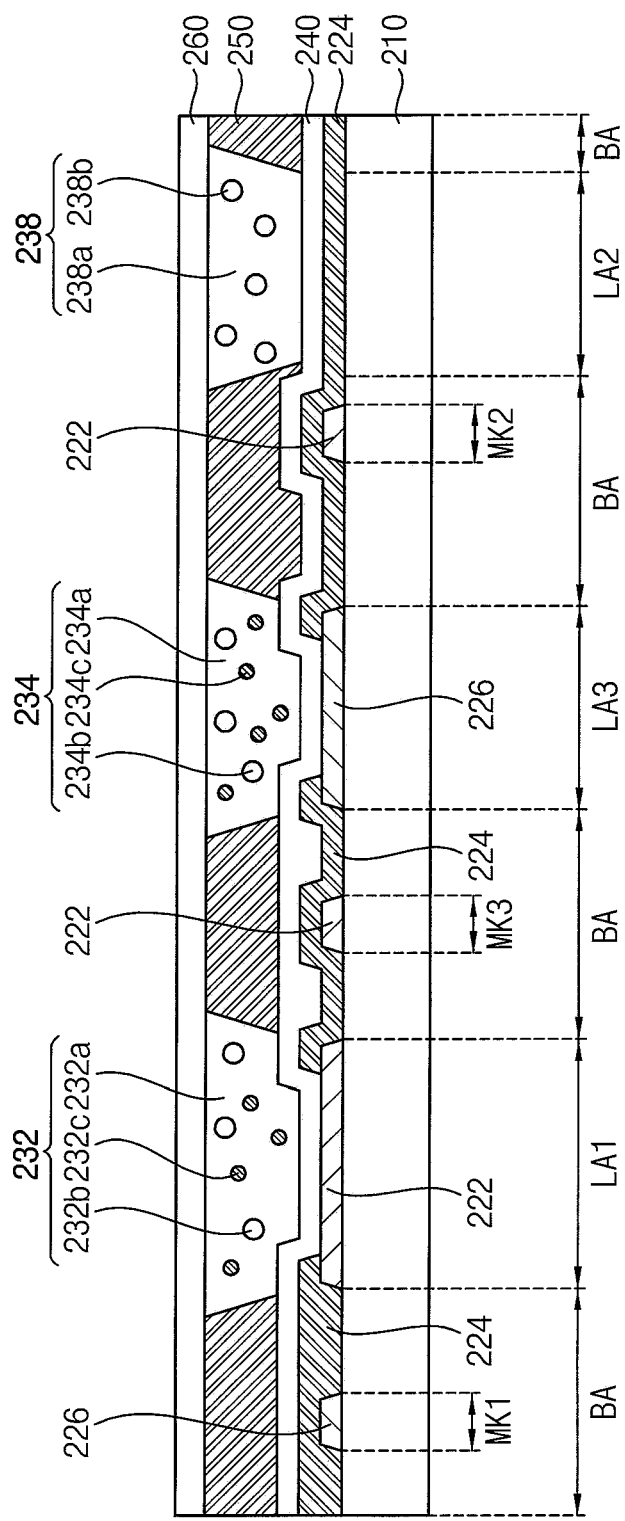

FIGS. 13 and 14 are cross-sectional views illustrating a color-converting substrate of a display device according to exemplary embodiments of the present inventive concepts.

Referring to the exemplary embodiment of FIG. 13, a color-converting substrate includes first to third light-emitting areas LA1, LA2 and LA3, a light-blocking area BA surrounding each of the first to third light-emitting areas LA1, LA2 and LA3, and first to third marking areas MK1, MK2 and MK3 disposed in the light-blocking area BA.

A first light-emitting area LA1 may overlap a first color filter 222 transmitting a first color light. A second light-emitting area LA2 may overlap a second color filter 224 transmitting a second color light. A third light-emitting area LA3 may overlap a third color filter 226 transmitting a third color light. For example, in an exemplary embodiment, the first color light may be a red light, the second color light may be a blue light and the third color light may be a green light.

A first marking area MK1 may be adjacent to the first light-emitting area LA1. The second marking area MK2 may be adjacent to the second light-emitting area LA2. The third marking area MK3 may be adjacent to the third light-emitting area LA3.

The second color filter 224 may further overlap the light-blocking area BA. The second color filter 224 may have openings overlapping the first to third marking areas MK1, MK2 and MK3.

In an exemplary embodiment, the first color filter 222 or the third color filter 226 may overlap the first to third marking areas MK1, MK2 and MK3.

For example, the first to third marking areas MK1, MK2 and MK3 may overlap a color filter transmitting a color light different from a light-emitting area adjacent thereto. For example, as shown in the exemplary embodiment of FIG. 13, the first color filter 222 may overlap the second marking area MK2 and the third marking area MK3. The first color filter 222 may be disposed in the openings of the second color filter 224 overlapping the second and third marking areas MK2, MK3. The third color filter 226 may overlap the first marking area MK1. The third color filter 226 may be disposed in the openings of the second color filter 224 overlapping the first marking area MK1. However, exemplary embodiments are not limited thereto. For example, in other exemplary embodiments, the first to third marking areas MK1, MK2 and MK3 may overlap a color filter transmitting a color light that is the same as a light-emitting area adjacent thereto. For example, the first color filter 222 may overlap the first marking area MK1, the second color filter 224 may overlap the second marking area MK2 and/or the third color filter 226 may overlap the third marking area MK3.

A partition wall 250 overlapping the light-blocking area BA is disposed on the color filters. The first and second color-converting layers 232 and 234 and a compensation layer 238 are disposed in receiving areas formed by the partition wall 250.

In an exemplary embodiment, in a plan view (e.g., in a plane defined by the first and second directions D1, D2 of FIG. 1), the light-blocking area BA overlaps the second color filter 224 (e.g., in a thickness direction of the second base substrate 210), and the first to third marking areas MK1, MK2 and MK3 overlap the first color filter 222 or the third color filter 226. Therefore, the first to third marking areas MK1, MK2 and MK3 have a reflective characteristic to an external light, which is different from a reflective characteristic of the remaining portion of the light-blocking area BA. Therefore, the marking areas MK1, MK2 and MK3 may be easily identified or detected by exposure to an external light.

Referring to the exemplary embodiment of FIG. 14, a second color filter 224 overlaps a second light-emitting area LA2, a light-blocking area BA and first to third marking areas MK1, MK2 and MK3. A first color filter 222 overlaps a first light-emitting area LA1, the second marking area MK2 and the third marking area MK3. A third color filter 226 overlaps a third light-emitting area LA3 and the first marking area MK1.

In an exemplary embodiment, the portions of the first color filter 222 and the third color filter 226 overlapping the second marking area MK2, the third marking area MK3 and first marking area MK1, respectively, are disposed between the second color filter 224 and a second base substrate 210.

Therefore, in a plan view, the light-blocking area BA overlaps the second color filter 224, and the first to third marking areas MK1, MK2 and MK3 overlap the first color filter 222 or the third color filter 226. Therefore, the first to third marking areas MK1, MK2 and MK3 have a reflective characteristic to an external light, which is different from a reflective characteristic of a remaining portion of the light-blocking area BA. Therefore, the marking areas MK1, MK2 and MK3 may be easily identified or detected.

FIGS. 15 to 18 are cross-sectional views illustrating a method for manufacturing a color-converting substrate of a display device according to exemplary embodiments of the present inventive concepts. FIG. 19 is a cross-sectional view illustrating a color-converting substrate of a display device according to an exemplary embodiment.

Figure 15:
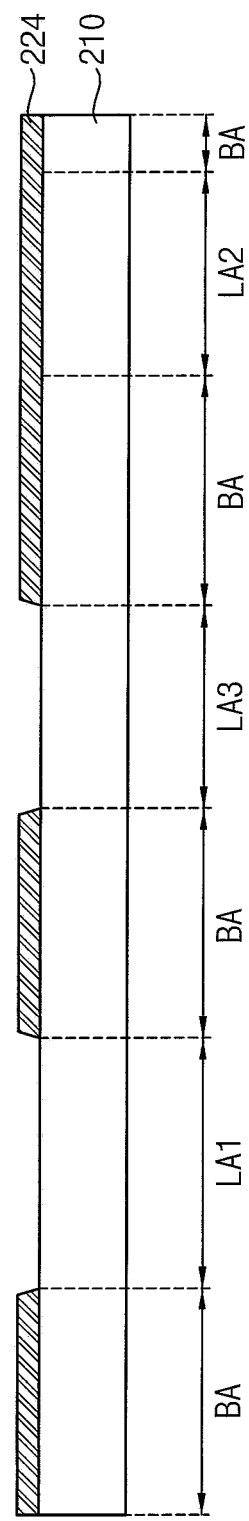
FIGS. 15 to 18 are cross-sectional views illustrating a method for manufacturing a color-converting substrate of a display device according to exemplary embodiments of the present inventive concepts.

Referring to the exemplary embodiment of FIG. 15, a second color filter 224 is formed on a second base substrate 210. The second color filter 224 overlaps a second light-emitting area LA2. The second color filter 224 may further overlap a light-blocking area BA surrounding the first to third light-emitting areas LA1, LA2 and LA3. The second color filter 224 may include openings corresponding to a first light-emitting area LA1 and a third light-emitting area LA3.

In an exemplary embodiment, the second color filter 224 may be a blue color filter that selectively transmits a blue light.

Figure 16:
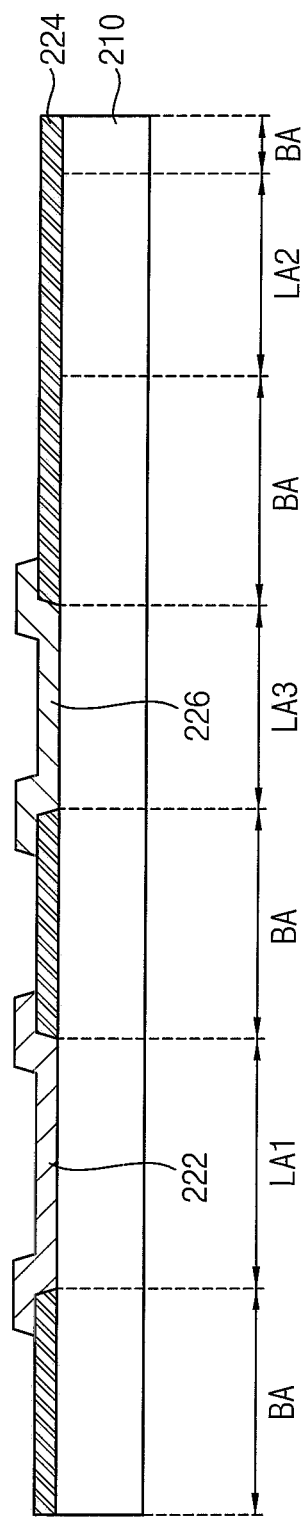

Referring to the exemplary embodiment of FIG. 16, a first color filter 222 and a third color filter 226 are formed on the second base substrate 210.

The first color filter 222 overlaps the first light-emitting area LA1. In an exemplary embodiment, the first color filter 222 may be a red filter that selectively transmits a red light.

The third color filter 226 overlaps the third light-emitting areas LA3. In an exemplary embodiment, the third color filter 226 may be a green filter that selectively transmits a green light.

An order of forming the color filters and positions thereof are not limited to those illustrated in the exemplary embodiments. For example, in other exemplary embodiments, the first color filter 222 and/or the third color filter 226 may be formed prior to the second color filter 224 so that the first color filter 222 and/or the third color filter 226 may be disposed between the second color filter 224 and the second base substrate 210.

Figure 17:
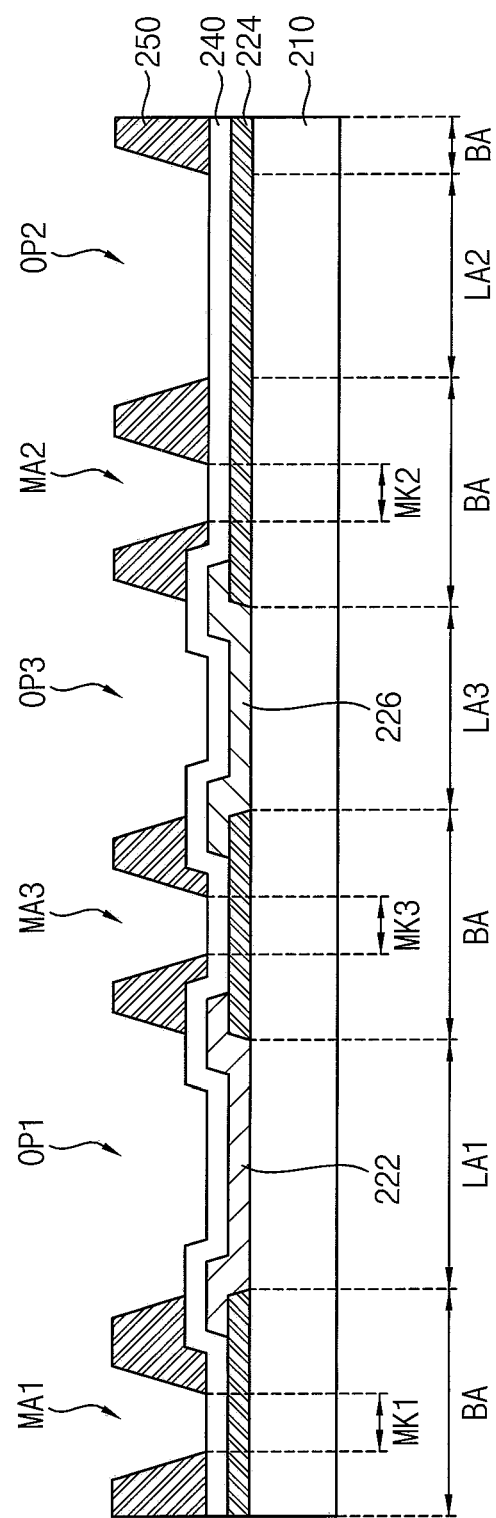

Referring to the exemplary embodiment of FIG. 17, a first protective layer 240 is formed to cover the color filters. However, exemplary embodiments of the present inventive concepts are not limited thereto and in some exemplary embodiments, the first protective layer 240 may be omitted. A partition wall 250 is formed on the first protective layer 240.

The partition wall 250 may entirely overlap the light-blocking area BA. The partition wall 250 may include first to third receiving areas OP1, OP2 and OP3 overlapping the first to third light-emitting areas LA1, LA2 and LA3.

For example, the first receiving area OP1 may overlap the first light-emitting area LA1, the second receiving area OP2 may overlap the second light-emitting area LA2, and the third receiving area OP3 may overlap the third light-emitting area LA3.

In an exemplary embodiment, the partition wall 250 may include first to third openings MA1, MA2 and MA3 overlapping the first to third marking areas MK1, MK2 and MK3, respectively.

Figure 18:
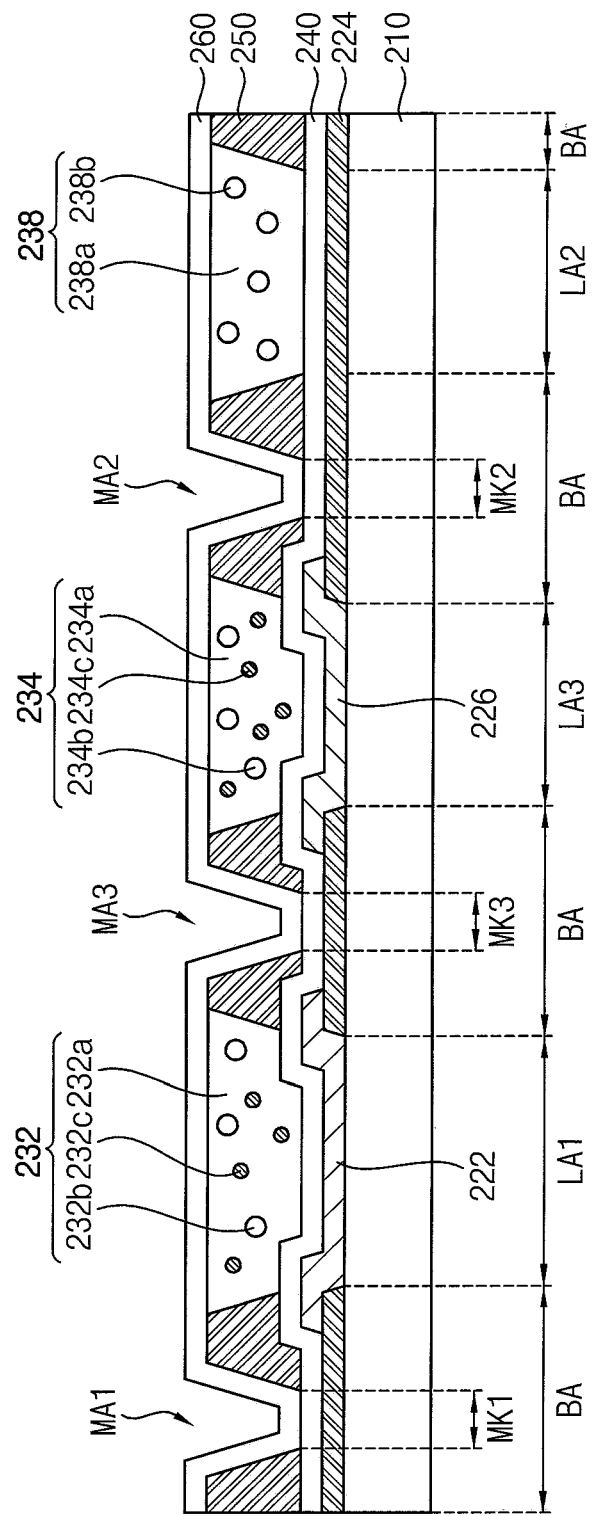
Figure 19:
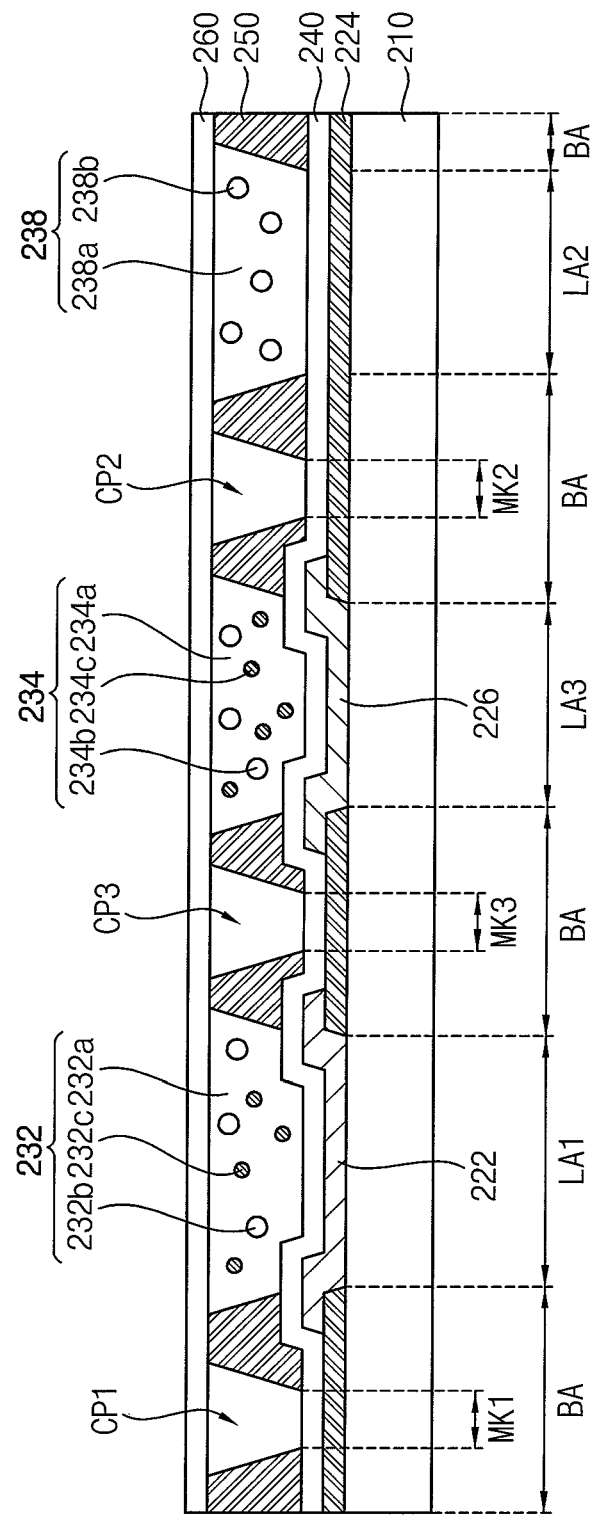
FIG. 19 is a cross-sectional view illustrating a color-converting substrate of a display device according to exemplary embodiments of the present inventive concepts.

Referring to the exemplary embodiment of FIG. 18, first and second color-converting layers 232 and 234 and a compensation layer 238 are formed in the first to third receiving areas OP1, OP2 and OP3, respectively.

A second protective layer 260 is formed to cover the first and second color-converting layers 232 and 234 and the compensation layer 238. As shown in the exemplary embodiment of FIG. 18, the second protective layer 260 also covers the partition wall 250 and extends within the first to third openings MA1, MA2, MA3 within the partition wall 250. As shown in the exemplary embodiment of FIG. 18, the second protective layer 260 may directly contact the first protective layer 240 in the first to third openings MA1, MA2, MA3 of the partition wall 250. The second color filter 224 may cover the entire light-blocking area BA and the second light-emitting layer LA2 and may only include openings corresponding to the first light-emitting layer LA1 and the third light-emitting layer LA3.

In the exemplary embodiment of FIG. 18, the light-blocking area BA overlaps the second color filter 224 and the partition wall 250. The first to third marking areas MK1, MK2 and MK3 overlap the second color filter 224. Therefore, the first to third marking areas MK1, MK2 and MK3 have a reflective characteristic to an external light, which is different from a reflective characteristic of a remaining portion of the light-blocking area BA. Thus, the first to third marking areas MK1, MK2 and MK3 may be easily identified or detected by exposure to an external light.

Furthermore, since the partition wall 250 including a light-blocking material is removed from the first to third openings MA1, MA2, MA3 corresponding to the first to third marking areas MK1, MK2 and MK3, an energy-transferring efficiency in a repairing process may be increased.

Referring to the exemplary embodiment of FIG. 19, first to third compensation patterns CP1, CP2 and CP3 may be formed in openings of a partition wall 250 overlapping the first to third marking areas MK1, MK2 and MK3, respectively. The first to third compensation patterns CP1, CP2 and CP3 may compensate for a step of the partition wall 250. Therefore, the first protective layer 240 and the second protective layer 260 may be spaced apart from each other with the first to third compensation patterns CP1, CP2 and CP3 disposed therebetween. In an exemplary embodiment, the first to third compensation patterns CP1, CP2 and CP3 may include a transparent cured resin, and may further include a coloring agent such as a dye, a pigment or the like.

Exemplary embodiments of the present inventive concepts may be applied to various display devices. For example, exemplary embodiments of the present inventive concepts may be applied to a vehicle-display device, a ship-display device, an aircraft-display device, portable communication devices, display devices for display or for information transfer, a medical-display device, etc. However, exemplary embodiments of the present inventive concepts are not limited thereto.

The foregoing is illustrative of exemplary embodiments and is not to be construed as limiting thereof. Although exemplary embodiments of the present inventive concepts have been described, those skilled in the art will readily appreciate that many modifications are possible in the exemplary embodiments without materially departing from the novel teachings and features of the present inventive concepts. Accordingly, all such modifications are intended to be included within the scope of the present invention. Therefore, it is to be understood that the foregoing is illustrative of various exemplary embodiments and is not to be construed as limited to the specific exemplary embodiments disclosed, and that modifications to the disclosed embodiments, as well as other embodiments, are intended to be included within the scope of the invention.

What is claimed is:

1. A display device comprising:
   a first substrate including lower electrodes, an upper electrode and a light-emitting layer disposed between the lower electrodes and the upper electrode; and
   a second substrate combined with the first substrate and defining light-emitting areas, the second substrate including:
   a color filter layer overlapping the light-emitting areas; and
   a light-blocking member overlapping a light-blocking area surrounding the light-emitting areas, the light-blocking member including openings overlapping the lower electrodes.

2. The display device of claim 1, wherein the color filter layer includes:
   a first color filter overlapping a first light-emitting area emitting light having a first color; and
   a second color filter overlapping a second light-emitting area emitting light having a second color that is different from the first color.

3. The display device of claim 2, wherein the light-blocking member comprises a portion of the second color filter.

4. The display device of claim 3, wherein the first color filter is disposed in at least a portion of the openings of the light-blocking member.

5. The display device of claim 2, wherein:
   the second substrate further includes a color-converting layer overlapping the first light-emitting area; and
   the color-converting layer is configured to convert a wavelength of an incident light to emit light having the first color.

6. The display device of claim 5, wherein:
   the light-blocking member is a partition wall having a receiving area; and
   the color-converting layer is disposed in the receiving area.

7. The display device of claim 6, wherein the second substrate further includes a compensation pattern disposed in the openings of the light-blocking member.

8. The display device of claim 1, wherein at least one of the openings of the light-blocking member has a different shape from other openings of the light-blocking member.

9. A display device comprising:
a first substrate including pixel electrodes and a common electrode; and
a second substrate combined with the first substrate,
the second substrate defines a plurality of light-emitting areas, a light-blocking area surrounding the plurality of light-emitting areas and a marking area disposed in the light-blocking area;
wherein the marking area overlaps a corresponding pixel electrode and has a reflective characteristic to an external light that is different from a reflective characteristic of a remaining portion of the light-blocking area to the external light.

10. The display device of claim 9, wherein the second substrate includes:
a color filter layer overlapping the plurality of light-emitting areas;
a color-converting layer overlapping at least a portion of the plurality of light-emitting areas; and
a partition wall overlapping the light-blocking area, the partition wall having a receiving area, wherein the color-converting layer is disposed in the receiving area.

11. The display device of claim 10, wherein the color filter layer includes:
a first color filter overlapping a first light-emitting area emitting light having a first color; and
a second color filter overlapping the light-blocking layer and a second light-emitting area emitting light having a second color that is different from the first color.

12. The display device of claim 11, wherein the second color filter includes an opening overlapping the marking area.

13. The display device of claim 12, wherein the first color filter further overlaps the marking area and is disposed in the opening of the second color filter.

14. The display device of claim 11, wherein the first color filter further overlaps the marking area.

15. The display device of claim 11, wherein the partition wall includes an opening overlapping the marking area.

16. The display device of claim 15, wherein the second substrate further includes a compensation pattern disposed in the opening of the partition wall.

17. A method for repairing a display device, the display device including a first substrate and a second substrate combined with the first substrate, the first substrate including pixel electrodes and a common electrode, wherein light-emitting areas, a light-blocking area surrounding the light-emitting areas and a plurality of marking areas disposed in the light-blocking area and respectively overlapping a corresponding pixel electrode are defined on the second substrate, the method comprising:
detecting a defective pixel of the display device; and
irradiating a laser onto a first marking area of the plurality of marking areas, the first marking area corresponding to the defective pixel.

18. The method of claim 17, wherein the laser is a long-wavelength laser.

19. The method of claim 17, wherein the plurality of marking areas has a reflective characteristic to an external light, which is different from a reflective characteristic of a remaining portion of the light-blocking area to the external light.

20. The method of claim 17, wherein:
the second substrate includes a light-blocking member overlapping the light-blocking area; and
the light-blocking member includes openings overlapping the plurality of marking areas.

21. A display device comprising:
a first substrate including a plurality of pixel electrodes, a common electrode and a plurality of driving elements connected to the plurality of pixel electrodes at a plurality of contact areas; and
a second substrate combined with the first substrate, the second substrate including:
a color filter layer including a first color filter, a second color filter and a third color filter overlapping a first light-emitting area, a second light-emitting area and a third light-emitting area, respectively;
a light-blocking area surrounding the first light-emitting area, the second light-emitting area and the third light-emitting area;
first to third marking areas disposed in the light-blocking area adjacent to the first light-emitting area, the second light-emitting area and the third light-emitting area, respectively, the first to third marking areas overlapping the plurality of pixel electrodes;
wherein at least one of the first to third marking areas also overlaps one contact area of the plurality of contact areas.

22. The display device of claim 21, wherein at least one of the first to third marking areas is disposed between one light-emitting area of the first to third light-emitting areas and one contact area of the plurality of contact areas.

* * * * *